US010018701B2

(12) United States Patent
Marshall et al.

(10) Patent No.: US 10,018,701 B2
(45) Date of Patent: Jul. 10, 2018

(54) REMOTE SENSING TO DERIVE CALIBRATED POWER MEASUREMENTS

(71) Applicant: Earth Networks, Inc., Germantown, MD (US)

(72) Inventors: Robert S. Marshall, Ijamsville, MD (US); Stan Heckman, Chelmsford, MA (US); Chonglin Liu, Rockville, MD (US); Christopher Dale Sloop, Mount Airy, MD (US); Scott Stickels, Lothian, MD (US); Donnie Bixler, Woodsboro, MD (US); Emily Stickels, North Bethesda, MD (US)

(73) Assignee: Whisker Labs, Inc., Germantown, MD (US)

( * ) Notice: Subject to any disclaimer, the term of this patent is extended or adjusted under 35 U.S.C. 154(b) by 0 days.

(21) Appl. No.: 15/476,424

(22) Filed: Mar. 31, 2017

(65) Prior Publication Data

US 2017/0205489 A1 Jul. 20, 2017

Related U.S. Application Data

(63) Continuation of application No. 15/275,061, filed on Sep. 23, 2016, now Pat. No. 9,702,959.

(Continued)

(51) Int. Cl.
*G01R 35/04* (2006.01)
*G01R 35/00* (2006.01)
(Continued)

(52) U.S. Cl.
CPC ........... *G01R 35/04* (2013.01); *G01R 15/207* (2013.01); *G01R 22/061* (2013.01); *G01R 35/005* (2013.01)

(58) Field of Classification Search
None
See application file for complete search history.

(56) References Cited

U.S. PATENT DOCUMENTS

| 6,226,600 B1 | 5/2001 | Rodenberg, III et al. |
| 6,771,058 B2 | 8/2004 | Lapinksi et al. |

(Continued)

FOREIGN PATENT DOCUMENTS

| WO | 2014165986 A1 | 10/2014 |
| WO | 2015154824 A1 | 10/2015 |

(Continued)

OTHER PUBLICATIONS

J. Froehlich et al., "Disaggregated End-Use Energy Sensing for the Smart Grid," IEEE Pervasive Computing, Jan.-Mar. 2011, pp. 28-39.

(Continued)

*Primary Examiner* — Jermele M Hollington
(74) *Attorney, Agent, or Firm* — Proskauer Rose LLP

(57) ABSTRACT

Described herein are methods and systems for identifying individual branch circuits coupled to a power distribution point. A sensor module positioned in proximity to the power distribution point and having a plurality of magnetic field sensors senses a magnetic field emitted by each of a plurality of branch circuits coupled to the power distribution point. A processor coupled to the sensor module determines a response of each magnetic field sensor to each of a plurality of changes in power associated with at least one of the plurality of branch circuits. The processor positions the responses of the magnetic field sensors to each change in power on a point in a multidimensional space, where each dimension of the multidimensional space corresponds to a magnetic field sensor. The processor identifies clusters of the points in the multidimensional space, each cluster represent- (Continued)

ing a different branch circuit and having a different vector direction.

18 Claims, 19 Drawing Sheets

Related U.S. Application Data

(60) Provisional application No. 62/232,278, filed on Sep. 24, 2015.

(51) Int. Cl.
*G01R 22/06* (2006.01)
*G01R 15/20* (2006.01)

(56) References Cited

U.S. PATENT DOCUMENTS

| | | | |
|---|---|---|---|
| 7,043,380 B2 | 5/2006 | Rodenberg, III et al. | |
| 7,174,260 B2 | 2/2007 | Tuff et al. | |
| 7,444,247 B2 | 10/2008 | Gagnon et al. | |
| 7,453,267 B2* | 11/2008 | Westbrock, Jr. | H02H 1/0038 324/142 |
| 7,467,049 B2 | 12/2008 | Hayes et al. | |
| 7,577,535 B2 | 8/2009 | Anderson et al. | |
| 7,912,660 B2 | 3/2011 | Anderson et al. | |
| 8,085,164 B2 | 12/2011 | Carkner | |
| 8,179,147 B2 | 5/2012 | Dargatz et al. | |
| 8,659,286 B2* | 2/2014 | Reynolds | G01R 15/18 324/117 R |
| 8,768,636 B2 | 7/2014 | McCullough et al. | |
| 8,773,280 B2 | 7/2014 | Carkner | |
| 8,805,628 B2* | 8/2014 | Patel | G01R 15/207 702/62 |
| 8,868,361 B2 | 10/2014 | McCullough et al. | |
| 9,057,746 B1 | 6/2015 | Houlette et al. | |
| 9,152,737 B1 | 10/2015 | Micali et al. | |
| 9,172,623 B1 | 10/2015 | Micali et al. | |
| 9,443,195 B2 | 9/2016 | Micali et al. | |
| 2009/0281673 A1 | 11/2009 | Taft | |
| 2009/0284249 A1 | 11/2009 | Syracuse et al. | |
| 2012/0068692 A1* | 3/2012 | Patel | G01R 15/207 324/202 |
| 2012/0271469 A9 | 10/2012 | Masters et al. | |
| 2013/0119972 A1* | 5/2013 | Maguire | G01R 35/005 324/74 |
| 2013/0271895 A1* | 10/2013 | Kuhns | H02J 13/0006 361/622 |
| 2014/0333286 A1* | 11/2014 | Wang | G01R 15/142 324/113 |
| 2014/0336960 A1 | 11/2014 | Haghighat-Kashani et al. | |
| 2015/0002137 A1* | 1/2015 | Patel | G01R 15/207 324/130 |
| 2015/0012147 A1 | 1/2015 | Haghighat-Kashani et al. | |
| 2015/0268281 A1 | 9/2015 | Haghighat-Kashani | |
| 2017/0090004 A1* | 3/2017 | Marshall | G01R 21/133 |

FOREIGN PATENT DOCUMENTS

| | | |
|---|---|---|
| WO | 2016081657 A1 | 5/2016 |
| WO | 2016085942 A1 | 6/2016 |

OTHER PUBLICATIONS

A. Rowe et al., "Contactless Sensing of Appliance State Transitions Through Variations in Electromagnetic Fields," BuildSys 2010, Nov. 2, 2010, ACM, 6 pages.

Exacter Technology, retrieved from http://www.exacterinc.com/exacter-technology, dated May 20, 2015, 2 pages.

Wattvision—first look—real-time energy monitoring sensors and software for businesses and homes, retrieved from http://www.wattvision.com/info/how_it_works, dated May 8, 2015, 3 pages.

Wattsworth project YouTube video uploaded on Jan. 26, 2016 by John Donnal, available at https://www.youtube.com/watch?v=xa15LVNTwis. Screenshot provided (taken on Oct. 6, 2016), 1 page.

* cited by examiner

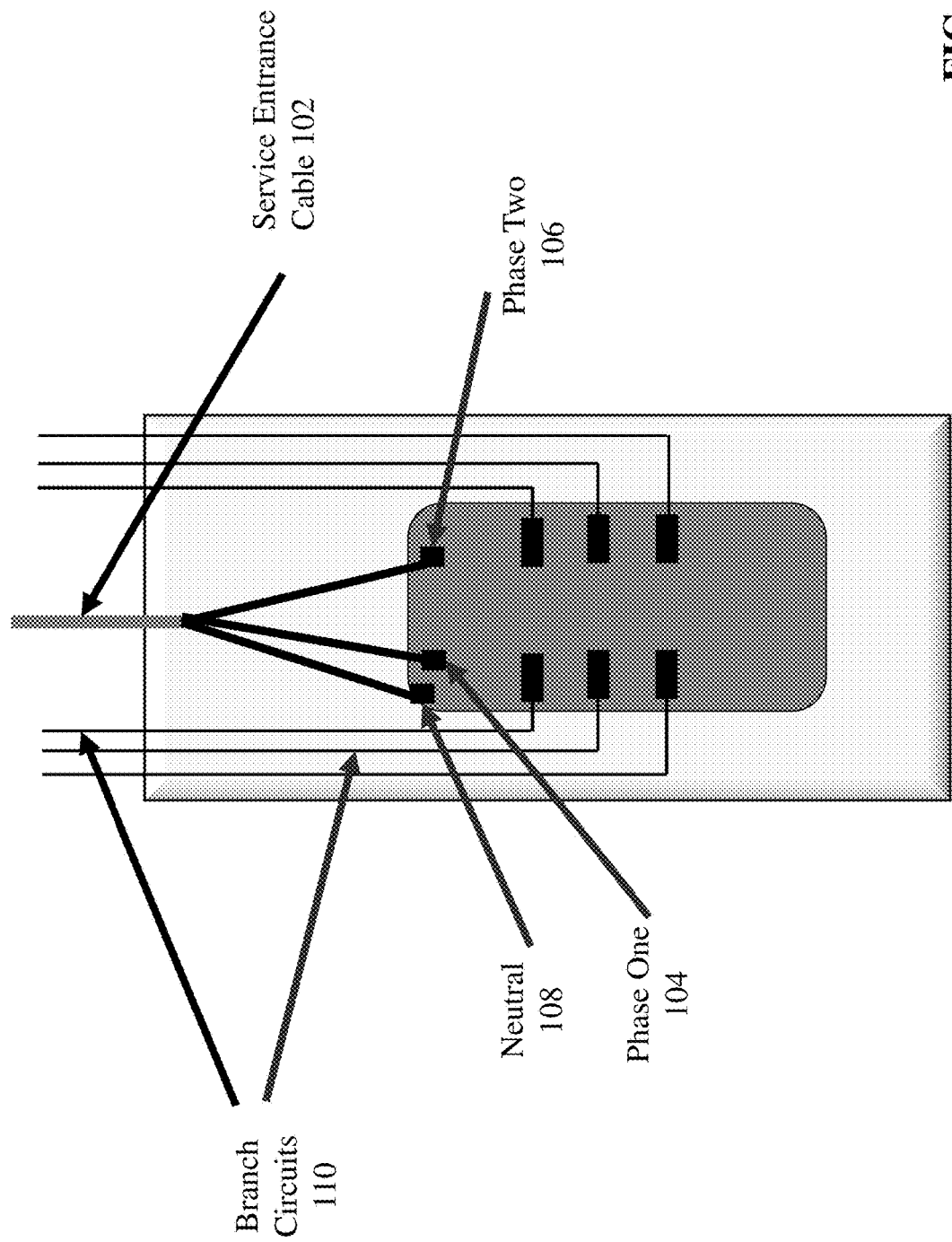

REMOTE SENSING TO DERIVE CALIBRATED POWER MEASUREMENTS

RELATED APPLICATIONS

This application is a continuation of U.S. patent application Ser. No. 15/275,061, filed on Sep. 23, 2016 now U.S. Pat. No. 9,702,959, which claims priority to U.S. Provisional Patent Application No. 62/232,278, filed on Sep. 24, 2015, the entirety of which are incorporated herein by reference.

TECHNICAL FIELD

The subject matter of the application relates generally to remote sensing to derive calibrated power measurements.

BACKGROUND

Currently, measuring power usage loads and fluctuations for residential and commercial environments is accomplished via Current Transformer (CT) clamp technology. Products such as smart meters and other energy monitoring products such as the TED 5000 series available from Energy, Inc. of Charleston, S.C., the Neurio Sensor available from Neurio Technology, Inc. of Vancouver, BC, Canada and the EHEM1 Home Electricity Monitor available from Eyedro Green Solutions, Inc. of Kitchener, ON, Canada utilize CT technology because it is relatively straightforward to discern power usage, as the magnetic fields from a single wire which a CT clamp surrounds have a simple physical relationship to the electrical current present in the wire. Such products typically determine the power by multiplying the instantaneous current sensed by each CT clamp by the time-varying voltage. By integrating this instantaneous power over a time period such as one second, the total power used during that one second time period can be calculated.

However, the installation of CT clamps is difficult and dangerous because the procedure requires removing of the outside protective panel of the electrical breaker box and further requires the installer to come in close contact with high-powered electrical lines that can cause personal physical harm or even death. This sort of installation is not practical for a homeowner to complete; most homeowners would not be comfortable performing the installation and instead opt to hire an electrical contractor to perform the work at a significant expense. Also, CT clamp installations take a significant amount of time due to the labor involved in removing fuse box covers, carefully connecting CT clamps and associated wires. Even an installation by a professional electrician can take thirty or more minutes.

SUMMARY

Therefore, what is needed is a method and system for measuring usage and fluctuations of power flowing through a power distribution point using remote sensing technology that does not require complicated and dangerous installation of components, such as CT clamps, into the interior of an electrical breaker box. The techniques described herein provide for a greatly simplified installation of a power measurement system by positioning a sensor module, equipped with magnetic field sensors, in proximity to a power distribution point. As an example, installations of the power measurement system described herein can be done by any person, even persons with no experience in working with electricity, and the installation can be complete in a short amount of time, typically less than ten minutes.

In the context of this invention, a power distribution point is any point in a power distribution system that (i) receives electrical power flowing from a power generation source (e.g., as operated by a utility provider, as provided from a solar panel array coupled to the power distribution point) and (ii) distributes the received electrical power to one or more distribution channels. In one embodiment, a power distribution point is an electrical breaker box as installed at a residence or business facility. An example of a power distribution point as a residential electrical breaker box 100 is shown in FIG. 1A. In this example, the electrical breaker panel receives electrical power from a utility provider via a service entrance cable 102 (i.e., a large cable that usually enters at the top of an electrical breaker box and that typically comprises three wires—a phase one wire 104, a phase two wire 106, and a neutral wire 108) and distributes the electrical power to branch circuits 110 that service different areas of the building. The phase one wire 104 and the phase two wire 106 typically carry a sinusoidal varying voltage of 120 volts. This is a standard two-phase wiring scheme and features electrical currents from each wire 104, 106 that are flowing in opposite directions and voltages that are 180 degrees out of phase. Note that the designations 'phase one' and 'phase two' for the phase wires are used herein for reference purposes to differentiate one phase versus another. It should be appreciated that in some embodiments, there may be one, two, or three phases. For example, a residential environment in Europe may have one phase, a residential environment in the U.S. may have two phases, and a commercial environment in the U.S. may have three phases.

Other examples of power distribution points with which the invention described herein can be used include, but are not limited to, devices that are upstream from the electrical breaker box (i.e., closer to the utility provider) and/or downstream from the electrical breaker box (i.e., further from the utility provider). Such devices can include other electrical panels that are coupled to the electrical breaker box in the building (e.g., receptacles for charging electronic vehicles, solar panel electricity transfer systems), smart meters, generators, upstream devices at various nodes in the utility provider's electrical distribution system, and so forth. It should also be appreciated that in some embodiments, a power distribution point can be a point on a wire or cable that is part of the power distribution system. For example, the portion of the service entrance cable that connects, e.g., a utility meter and an electrical breaker box can be considered a power distribution point because power is flowing through the wires of the service entrance cable.

FIG. 1B is a diagram of a power distribution system that depicts exemplary locations for the sensor module described herein to be positioned in relation to various power distribution points. As shown in FIG. 1B, a sensor module SM1 is positioned on a line between a utility transformer and a smart meter (e.g., as located at a residence). Sensor module SM2 is positioned on the exterior box of the smart meter. Sensor module SM3 is positioned on a wall in proximity to the electrical breaker box that houses the main electrical panel of the residence (e.g., at or near the location that the service entrance cable enters the main panel). Sensor module SM4 is positioned on the exterior of the electrical breaker box. Sensor module SM5 is positioned on a line between the electrical breaker box and a sub electrical panel (e.g., a dedicated electrical panel elsewhere in the residence). Sensor module SM6 is positioned on the exterior of the sub panel box. Sensor module SM7 is positioned on a line (or on a transfer apparatus) that couples solar panels to the electrical breaker box.

Furthermore, in contrast to the CT clamp technology described above, the system and method described herein provides the advantage of sensing more complex magnetic fields as produced by the power flowing through the power distribution point, such as the magnetic fields produced from the wires 104, 106 in the service entrance cable as well as the magnetic fields produced by the power flowing through the individual branch circuits 110 that, e.g., extend from the power distribution point to various locations in the building. The system and method also advantageously use the data sensed via the magnetic field sensors to identify individual branch circuits that are coupled to a power distribution point and further to identify and monitor specific devices (e.g., appliances, electronics, and the like) on each branch circuit.

Generally, the system and method described herein uses one or more magnetic field sensors in a sensor module to sense the magnetic field emitted by the power distribution point as power flows through the power distribution point, including the branch circuits connected to the power distribution point. In some embodiments, the sensor module is positioned at different locations in proximity to the power distribution point. In the example of an electrical breaker box, the sensor module can be affixed to the exterior of the electrical breaker box, on or near the service line entrance cable, and/or on a wall in proximity to the electrical breaker box. It should be appreciated that the above locations are merely examples, and the sensor module can be placed anywhere in proximity to the power distribution point where the magnetic fields from the power flowing through the power distribution point can be sensed. In addition, the techniques described herein do not generally require a specific orientation of the magnetic field sensors to each other and/or the power distribution point.

The invention, in one aspect, features a method for remote sensing to derive a calibrated power measurement for a power distribution point. One or more magnetic field sensors of a sensor module sense a magnetic field emitted by the power distribution point, where the sensor module is positioned in proximity to the power distribution point. A voltage sensor coupled to the sensor module senses a voltage carried in the power distribution point. A first processor coupled to the sensor module generates an uncalibrated power measurement for each magnetic field sensor, the uncalibrated power measurement derived from the magnetic field sensed by the magnetic field sensor and the voltage sensed by the voltage sensor. A second processor coupled to the sensor module determines a response of each magnetic field sensor to a known power load being drawn through the power distribution point. The second processor derives a transfer function using the response of each magnetic field sensor to the known power load. The second processor applies the transfer function to the uncalibrated power measurement for each magnetic field sensor to generate the calibrated power measurement for the power distribution point.

The invention, in another aspect, features a system for remote sensing to derive a calibrated power measurement for a power distribution point. The system comprises a sensor module with one or more magnetic field sensors positioned in proximity to the power distribution point. The magnetic field sensors are configured to sense a magnetic field emitted by the power distribution point. The system further comprises a voltage sensor coupled to the sensor module. The voltage sensor is configured to sense a voltage carried in the power distribution point. The system further comprises a first processor coupled to the sensor module. The first processor is configured to generate an uncalibrated power measurement for each magnetic field sensor. The uncalibrated power measurement is derived from the magnetic field sensed by the magnetic field sensor and the voltage sensed by the voltage sensor. The system further comprises a second processor coupled to the sensor module. The second processor is configured to determine a response of each magnetic field sensor to a known power load being drawn through the power distribution point, derive a transfer function using the response of each magnetic field sensor to the known power load, and apply the transfer function to the uncalibrated power measurement for each magnetic field sensor to generate the calibrated power measurement for the power distribution point.

The invention, in another aspect, features a method of remote sensing to derive a calibrated power measurement for a power distribution point. One or more magnetic field sensors of a sensor module sense a magnetic field emitted by the power distribution point, where the sensor module is positioned in proximity to the power distribution point. A first processor coupled to the sensor module generates an uncalibrated current measurement for each magnetic field sensor. The uncalibrated current measurement is derived from the magnetic field sensed by the magnetic field sensor. A second processor coupled to the sensor module determines a response of each magnetic field sensor to a known current load being drawn through the power distribution point. The second processor derives a transfer function using the response of each magnetic field sensor to the known current load. The second processor applies the transfer function to the uncalibrated current measurement for each magnetic field sensor and a voltage carried by the power distribution point to generate the calibrated power measurement for the power distribution point.

The invention, in another aspect, features a system for remote sensing to derive a calibrated power measurement for a power distribution point. The system comprises a sensor module with a sensor module with one or more magnetic field sensors positioned in proximity to the power distribution point. The magnetic field sensors are configured to sense a magnetic field emitted by the power distribution point. The system further comprises a first processor coupled to the sensor module, the first processor configured to generate an uncalibrated current measurement for each magnetic field sensor. The uncalibrated current measurement is derived from the magnetic field sensed by the magnetic field sensor. The system further comprises a second processor coupled to the sensor module. The second processor is configured to determine a response of each magnetic field sensor to a known current load being drawn through the power distribution point; derive a transfer function using the response of each magnetic field sensor to the known current load; and apply the transfer function to the uncalibrated current measurement for each magnetic field sensor and a voltage carried by the power distribution point to generate the calibrated power measurement for the power distribution point.

Any of the above aspects can include one or more of the following features. In some embodiments, the power distribution point is an electrical breaker box. In some embodiments, the sensor module is affixed to the exterior of the electrical breaker box. In some embodiments, the voltage sensor is coupled to a power supply electrically connected to the power distribution point. In some embodiments, a calibrator circuit coupled to the power distribution point is activated to draw the known power load through the power distribution point. In some embodiments, the calibrator circuit is a resistor.

In some embodiments, deriving a transfer function comprises deriving a series of coefficients each associated with the uncalibrated power measurement for a magnetic field sensor. In some embodiments, deriving the series of coefficients comprises determining a quasi-power for each of the magnetic field sensors based upon the uncalibrated power measurement for a magnetic field sensor. In some embodiments, determining the quasi-power comprises integrating for each magnetic field sensor the uncalibrated power measurement in time to determine a current (I) measured by the magnetic field sensor; multiplying the current by a voltage from the voltage sensor (I·V); and integrating I·V over one cycle.

In some embodiments, the second processor is located in a server computing device coupled to the sensor module. In some embodiments, the first processor transmits the uncalibrated power measurement for each magnetic field sensor to the server computing device. In some embodiments, the calibrated power measurement for the power distribution point is transmitted to a server computing device.

In some embodiments, the magnetic field sensors are arranged in a predetermined geometric configuration within a housing of the sensor module. In some embodiments, the magnetic field sensors are arranged at different orientations with respect to each other.

In some embodiments, a server computing device configured to collect a set of calibrated power measurements for each of a plurality of power distribution points distributed across a predefined geographical area, and determine one or more power signatures that are common across at least a plurality of the sets of calibrated power measurements. In some embodiments, the one or more power signatures correspond to a failure of equipment in a power generation system that is coupled to the plurality of power distribution points.

The invention, in another aspect, features a method of identifying individual branch circuits coupled to a power distribution point. A plurality of magnetic field sensors of a sensor module senses a magnetic field emitted by each of a plurality of branch circuits coupled to the power distribution point, where the sensor module is positioned in proximity to the power distribution point. A processor coupled to the sensor module determines a response of each magnetic field sensor to each of a plurality of changes in power associated with at least one of the plurality of branch circuits. The processor positions the responses of the magnetic field sensors to each change in power on a point in a multidimensional space, where each dimension of the multidimensional space corresponds to a magnetic field sensor. The processor identifies clusters of the points in the multidimensional space, each cluster representing a different branch circuit and having a different vector direction.

The invention, in another aspect, features a system for identifying individual branch circuits coupled to a power distribution point. The system comprises a sensor module positioned in proximity to the power distribution point and having a plurality of magnetic field sensors configured to sense a magnetic field emitted by each of a plurality of branch circuits coupled to the power distribution point. The system further comprises a processor coupled to the sensor module, the processor configured to determine a response of each magnetic field sensor to each of a plurality of changes in power associated with at least one of the plurality of branch circuits. The processor is further configured to position the responses of the magnetic field sensors to each change in power on a point in a multidimensional space, where each dimension of the multidimensional space corresponds to a magnetic field sensor. The processor is further configured to identify clusters of the points in the multidimensional space, each cluster representing a different branch circuit and having a different vector direction.

Any of the above aspects can include one or more of the following features. In some embodiments, the processor determines an amplitude associated with each change in power, groups one or more points in the multidimensional space that are associated with a single branch circuit and that have a similar amplitude, and identifies a state change of a device coupled to the branch circuit based upon the amplitude. In some embodiments, each identified cluster of points in the multidimensional space is arranged in a line along the associated vector direction. In some embodiments, the processor determines whether at least one of the changes in power corresponds to a hazard associated with the branch circuit.

In some embodiments, a calibration device coupled to one of the branch circuits draws a known power load through the power distribution point, and the processor identifies the branch circuit to which the calibration device is attached based upon measurement of the known power load by the sensor module. In some embodiments, the calibration device is a portable calibrator plugged into a receptacle on one of the branch circuits.

In some embodiments, the processor transmits information associated with the identified branch circuit to which the calibration device is attached to a mobile computing device, receives a location identifier associated with a physical location of the identified branch circuit, and maps the location identifier to the identified branch circuit. In some embodiments, the sensor module comprises fewer magnetic field sensors than a number of branch circuits. In some embodiments, the processor stores measurement data associated with at least a plurality of the branch circuits in an auxiliary memory coupled to the processor.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIG. 1A is a diagram of an electrical breaker box.

DETAILED DESCRIPTION

Figure 1B:
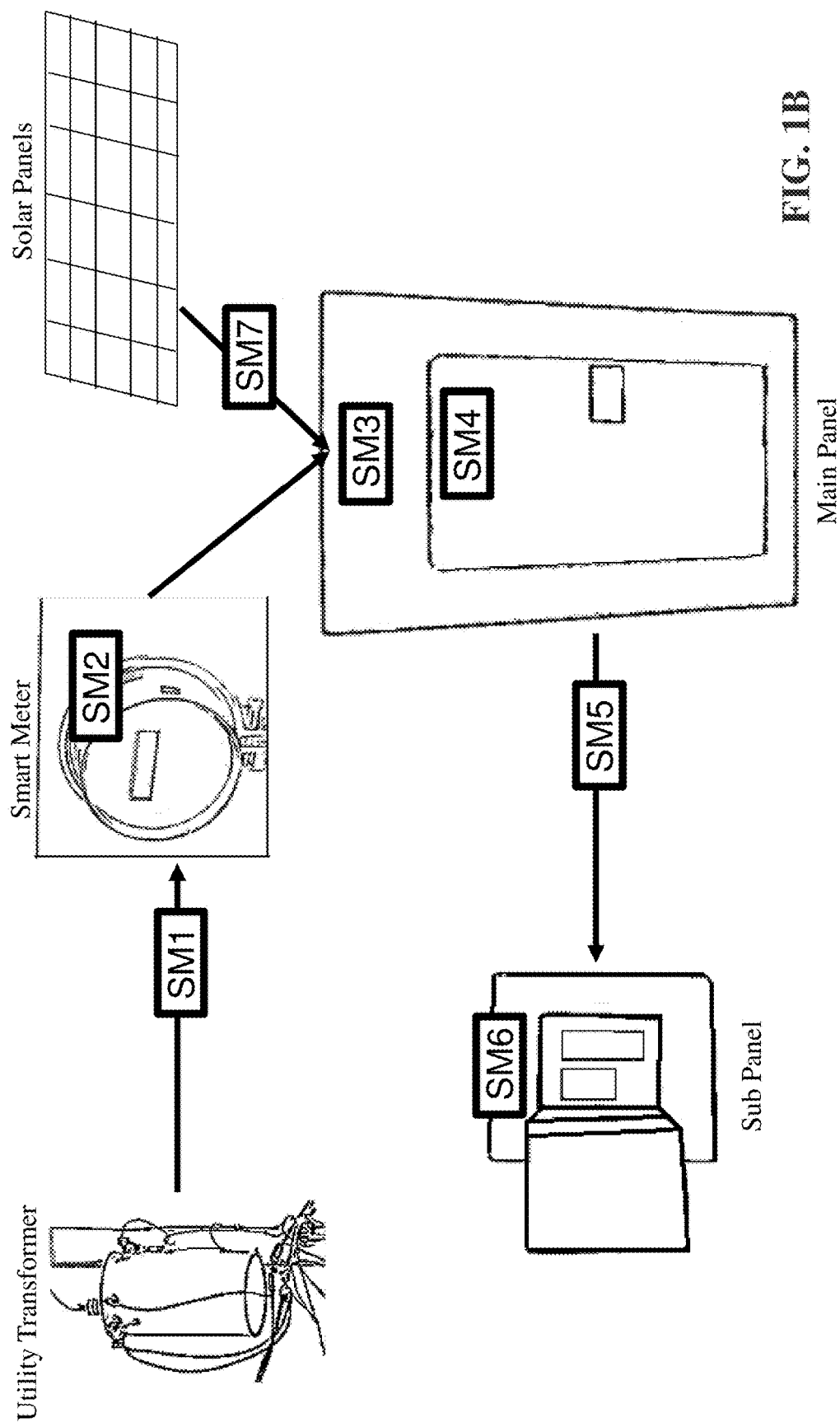
FIG. 1B is a diagram of a power distribution system that depicts exemplary locations for the sensor module to be positioned in relation to various power distribution points.
Figure 2:
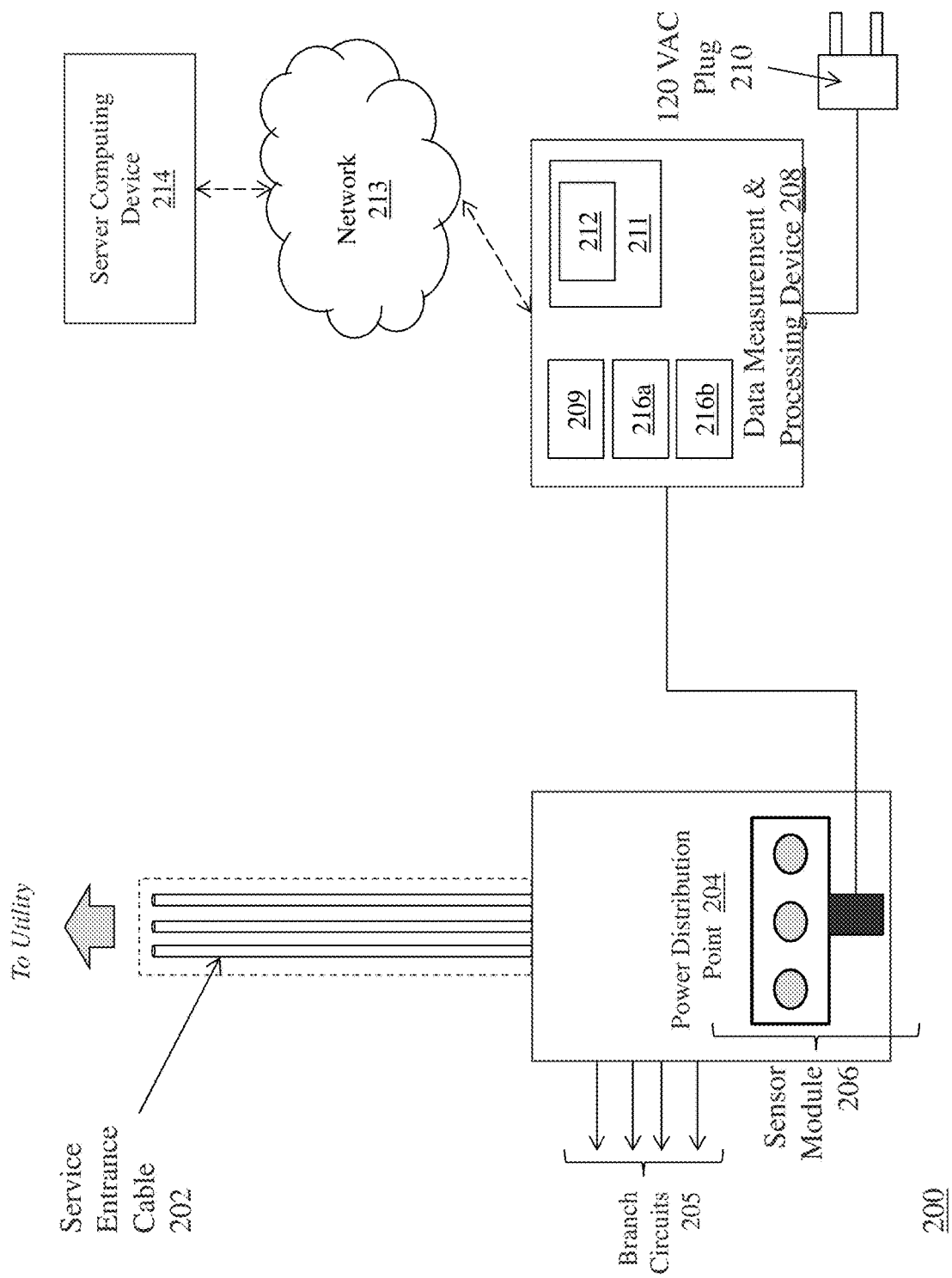
FIG. 2 is a block diagram of a system for remote sensing to derive calibrated power measurements for a power distribution point.

FIG. 2 is a block diagram of a system 200 for remote sensing to derive a calibrated power measurement for a power distribution point. The system 200 includes a service entrance cable 202 that enters a power distribution point 204 (e.g., an electrical breaker box) that transfers the power received from the service entrance cable to, e.g., branch circuits 205 that feed the power to appliances and outlets, such as one would find in a residential environment, or other building or facility.

The system 200 further includes a sensor module 206 positioned in proximity to the power distribution point 204. In the example shown in FIG. 2, the sensor module 206 is affixed to the exterior of the power distribution point 204. However, as set forth above, it should be appreciated that the sensor module in some embodiments is positioned in various locations that are in proximity to the power distribution point 204, such as on or near the service entrance cable 202 or on a wall near the power distribution point 204.

The sensor module 206 includes one or more magnetic field sensors. Exemplary magnetic field sensors include, but are not limited to: Hall Effect sensors, magneto resistive sensors, or magnetic coil pickups. As shown in FIG. 2, the sensor module includes three sensors (i.e., the gray circles within the sensor module 206) that sense the magnetic fields emitted from the wires of the service entrance cable 202 that connect to the power distribution point 204 and the wires that comprise the branch circuits 205. In some embodiments, the sensors are oriented within the sensor module to detect the magnetic fields from different distances and/or angles around the power distribution point 204. For example, one sensor or group of sensors can be positioned within the sensor module 206 such that the faces of each of the sensor(s) are not oriented at a 90-degree angle to the service entrance cable 202/power distribution point 204/branch circuits 205, but instead are oriented at different angle(s). Also, in some embodiments, the sensor module 206 includes a processor that can generate an uncalibrated power measurement for each magnetic field sensor, as will be described below. As referenced above, it should be appreciated that in some embodiments the sensor module 206 includes a single sensor and in other embodiments, the sensor module 206 includes a plurality of sensors.

As shown in FIG. 2, the sensor module 206 is coupled to a cable (e.g., a network cable) that connects the sensor module 206 to a data measurement and processing device 208. However, it should be appreciated that other configurations of the elements shown in FIG. 2 can be implemented without departing from the scope of invention. For example, although FIG. 2 shows a single sensor module that is communicatively coupled to a separate data measurement and processing device 208, it should be appreciated that the sensor module 206 and the data measurement and processing device 208 can be located within the same physical housing—thereby comprising a single device. In another example, the sensor module 206 and the data measurement and processing device 208 can be equipped with wireless networking circuitry (e.g., WiFi antenna) that enables the respective devices 206, 208 to communicate as described herein. In some embodiments, the sensor module 206 can be based upon the STM32F205 ARM Cortex MS processor by ST Micro and the Broadcom BCM43362 WiFi chip for communications, which provides 12-bit A/D and wireless communications in a single device.

As can be expected, the branch circuits 205 that receive power from the power distribution point 204 and distribute the power also emit magnetic fields that can be detected by the sensor module 206. In some instances, the magnetic fields emitted by the branch circuits 205 may be considered as 'noise' because these fields can alter the readings obtained by the sensors of the magnetic fields emitted by the power distribution point 204 and/or the service entrance cable 202. However, the magnetic field emitted by each branch circuit 205 can also be considered as a separate signal to be captured by the magnetic field sensors of the sensor module 206, and analyzed by the data measurement and processing device 208. It should be appreciated that while FIG. 2 depicts three sensors within the sensor module 206, the module can include various other numbers of sensors (e.g., four, six, ten, twelve) that detect the magnetic fields from the power distribution point 204 and also to detect the magnetic fields from the branch circuits 205. In some embodiments, the magnetic field sensors of the sensor module 206 can be arranged in a particular geometric configuration in relation to each other.

Further, in some embodiments, the sensor module 206 can also include or be coupled to a radio frequency (RF) antenna configured to measure a time-varying electric field produced by the time-varying voltage (dV/dt) of the power distribution point 204. Because the RF antenna senses the time-varying component of the electric field, and hence the time-varying component of the voltage on the power distribution point 204, the system is able to detect very fast changing voltages that may be caused by a variety of circumstances, some potentially dangerous, such as surges introduced from the utility distribution system, large appliances turning on and off, electrical shorts and/or sparks in the local electrical system, poor power quality, and so forth. The system can be configured to detect these changing voltages and generate reports and/or alerts to warn end users about possible dangers existing in the electrical system—as will be described in greater detail below.

Continuing with FIG. 2, the data measurement and processing device 208 receives magnetic field measurement data from the magnetic field sensors of the sensor module 206 and, in some embodiments, processes the measurement data to determine both uncalibrated power measurements and calibrated power measurements. The data measurement and processing device 208 comprises computing hardware such as one or more processors, memory, a communications module (e.g., WiFi circuitry), a calibration circuit 209, and other signal processing circuitry to perform the data collection, calibration, and power measurement processes described herein. In one embodiment, the data measurement and processing device 208 comprises two processors 216a, 216b to receive and process the data received from the sensor module 206; a first one 216a of the processors is configured to generate an uncalibrated power measurement for each magnetic field sensor and a second one 216b of the processors is configured to generate a calibrated power measurement for the power distribution point, as will be described below. In other embodiments, the processing described in this paragraph can be executed by a single processor located in either the sensor module 206 or the data measurement and processing device 208. In still other embodiments, the first processor and the second processor can be located in any of the devices described herein—such as the sensor module 206, the data measurement and processing device 208, and/or the server computing device 214.

The data measurement and processing device 208 also includes a power supply 211 that is connected to a receptacle (e.g., a power outlet) via a 120 VAC plug 210 (in some embodiments, the plug can be 220V). In one embodiment, the device 208 is based upon the STM32F205 ARM Cortex MS processor by ST Micro and the Broadcom BCM43362 WiFi chip for communications, which provides 12-bit A/D and wireless communications in a single device. The data measurement and processing device 208, or in some cases the power supply 211 itself, further includes a voltage sensor 212 that is capable of measuring voltage directly on the power line within the power supply 211.

The data measurement and processing device 208 is further coupled to a communications network 213 that enables the device 208 to communicate with a server computing device 214 that, in some embodiments, may be at a different location than the data measurement and processing device 208. For example, the device 208 can communicate via the Internet (e.g., via a wireless connection to a router or other apparatus installed locally) to transmit power measurement data to the server computing device 214. In some embodiments, the server computing device 214 can store the power measurement data and provide other functions or services with respect to the power measurement data. As mentioned above, the sensor module 206 and/or the data measurement and processing device 208 can transmit data to the server computing device 214—such as sending the server computing device 214 uncalibrated power measurement data so that the server computing device 214 can generate the calibrated power measurements. In another example, the server computing device 214 can enable a user to access power measurement data for his or her residence (e.g., via a browser interface) and view reports, data summaries, alerts, and other types of information that relate to the power measurement data being captured and processed by the system 200, as will be described in greater detail below.

Figure 3:
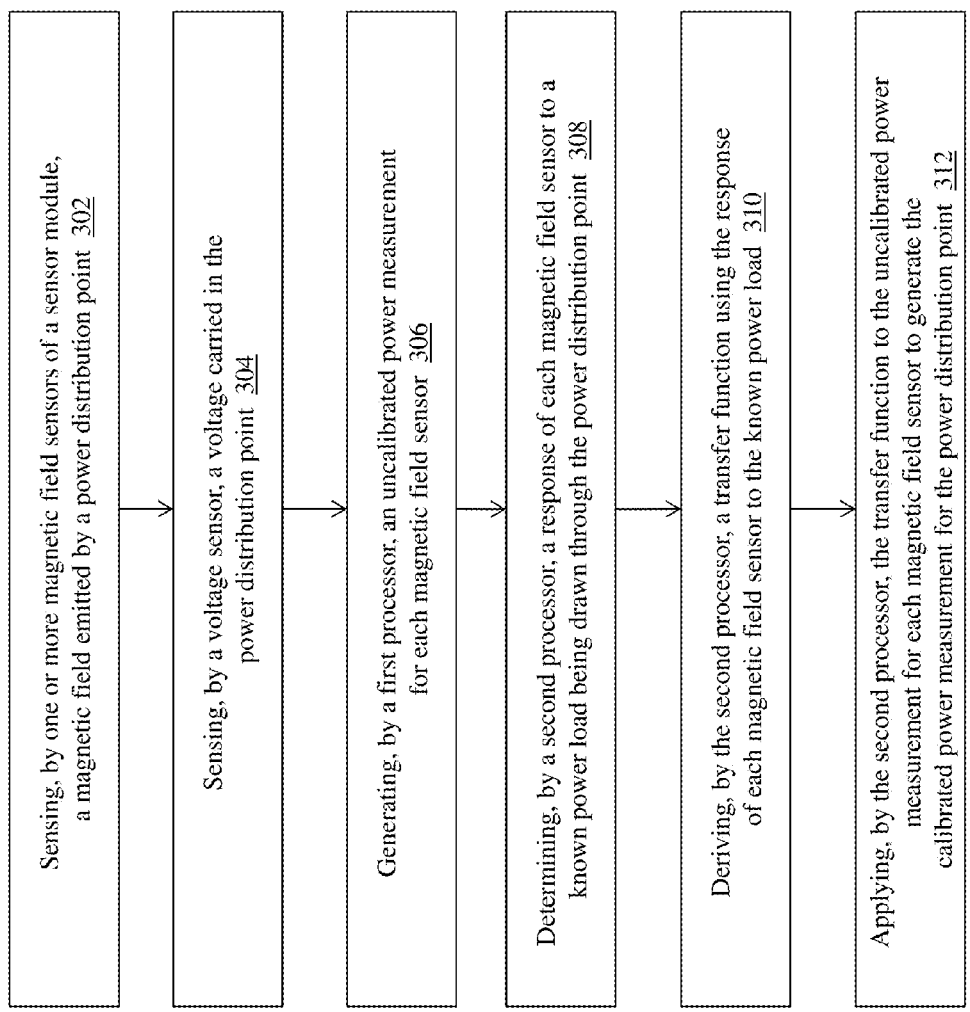
FIG. 3 is a flow diagram of a method for remote sensing to derive calibrated power measurements for a power distribution point.

FIG. 3 is a flow diagram of a method 300 for remote sensing to derive a calibrated power measurement for a power distribution point, using the system 200 of FIG. 2. One or more magnetic field sensors of the sensor module 206 senses (302) a magnetic field emitted by the power distribution point 204. As mentioned above, and as shown in FIG. 2, the sensor module 206 is positioned in proximity to the power distribution point 204. Each magnetic field sensor generates an output voltage that is proportional to the magnetic fields detected by the sensor, where the magnetic field is proportional to the changing current flowing through each of the wires (dI/dt). As noted above, in some embodiments the magnetic field sensor is a Hall Effect sensor, which measures the magnetic field proportional to the current (I) flowing through the wires, not the changing current.

A voltage sensor (e.g., voltage sensor 212) senses (304) a voltage carried in the power distribution point 204. A first processor 216a coupled to the sensor module 206 generates (306) an uncalibrated power measurement for each magnetic field sensor. The first processor 216a derives each uncalibrated power measurement from the magnetic field sensed by the respective sensor and the voltage sensed by the voltage sensor. For example, because each magnetic field sensor produces an output related to dI/dt, the processor 216a of the sensor device 206 (or in some embodiments, the data measurement and processing device 208) integrates the output from the sensor to produce instantaneous current at the time of the measurement. As noted above, it should be appreciated that Hall Effect sensors measures the magnetic field proportional to I, which does not need to be integrated.

Figure 4:
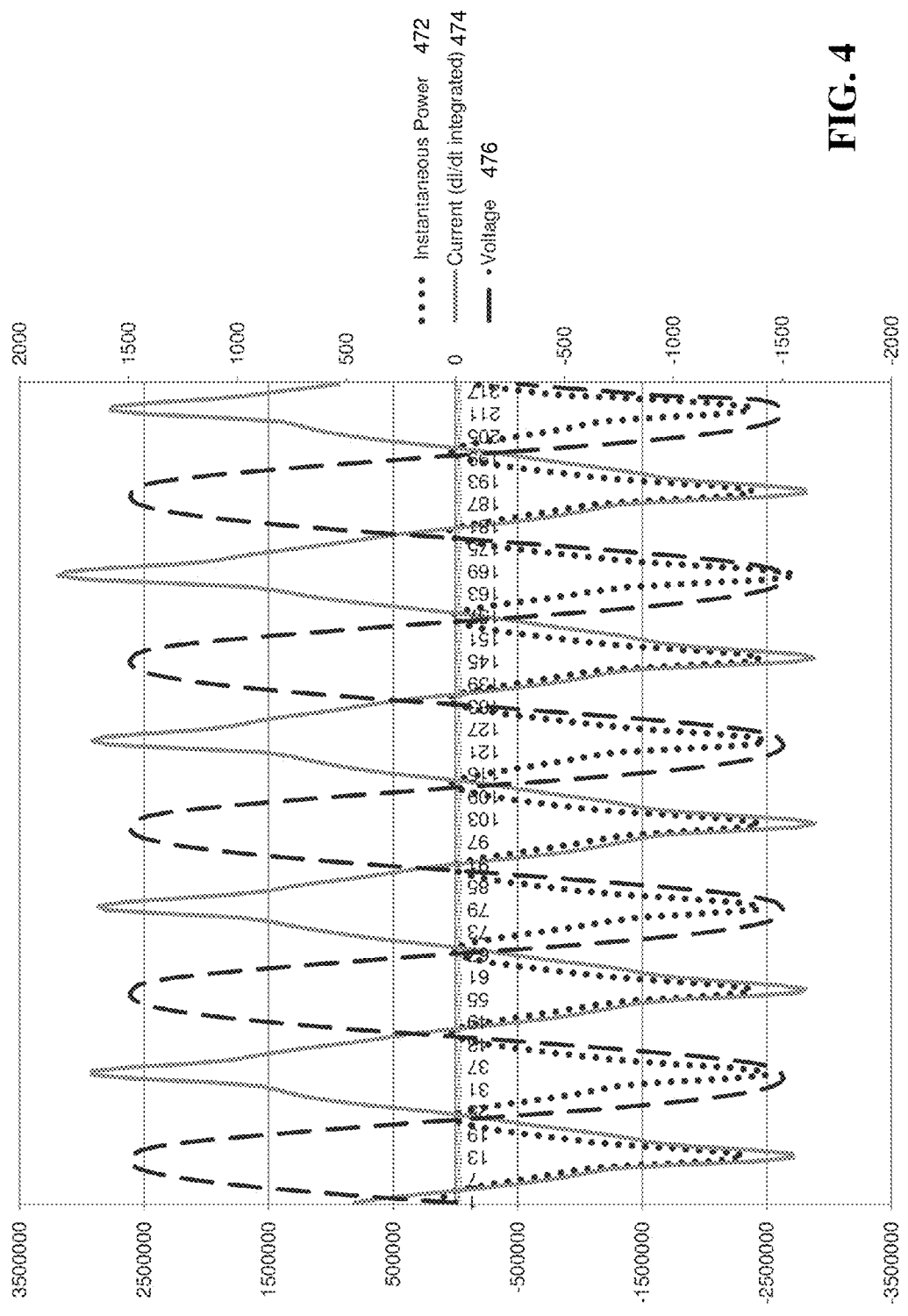
FIG. 4 is a diagram of a graph showing waveforms for instantaneous power, current (dI/dt integrated), and voltage.

As one example, FIG. 4 depicts waveforms that correspond to the instantaneous power 472, the current (dI/dt integrated) 474, and the voltage 476. The first processor 216a coupled to the sensor module 206 multiplies the integrated current by the instantaneous voltage, and the first processor 216a integrates the instantaneous power over a time period to produce an uncalibrated power output. At this juncture, the first processor 216a determines an uncalibrated power output for each of the magnetic field sensors because the first processor does not have detailed information about, e.g., how close each magnetic field sensor is to each of the wires in the power distribution point 204 and thus there is not enough information at this point to determine an exact current flow.

Figure 5:
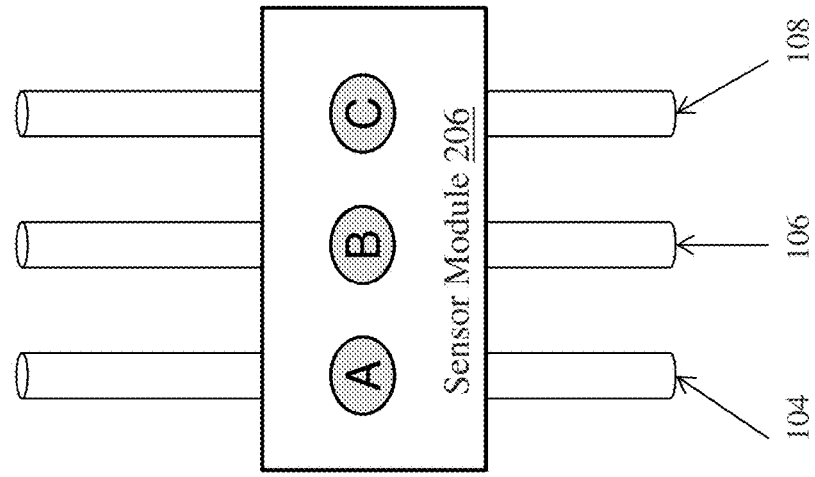
FIG. 5 is a diagram of a sensor module with three magnetic field sensors positioned in proximity to the service entrance cable of a power distribution point.

As can be appreciated, the magnetic field sensed by each sensor in the sensor module 206 is a linear combination of the magnetic field sensed from each wire in the power distribution point 204 (e.g., the phase one wire 104, the phase two wire 106, and the neutral wire 108 of the service entrance cable 202, and/or each branch circuit 205). In a simplified example, FIG. 5 is a diagram of a sensor module 206 with three magnetic field sensors A, B, and C that are positioned in proximity to the wires of the service entrance cable 202 in the power distribution point 204 (i.e., the phase one wire 104, the phase two wire 106 and the neutral wire 108). Using this configuration as an example, the magnetic field from wire 104 is detected more strongly by sensor A than sensors B or C because sensor A is closer to wire 104 than sensors B and C. Similarly, the magnetic field from wire 106 is detected more strongly by sensor B than sensors A or C because sensor B is closer to wire 106 than sensors A and C.

As is known with respect to CT clamps, calibration of a CT clamp is relatively simple because the measurement obtained by the CT clamp is directly proportional to the power flowing through the line to which the CT clamp is attached. However, in the system and method described herein, calibration of the magnetic field sensors is more complicated because the proportionality of the signal detected by the sensors to the power flowing through the corresponding line is not known and must be calculated.

Turning back to FIG. 3, a second processor 216b coupled to the sensor module 206 (e.g., a processor located at the data measurement and processing device 208 and/or a processor located at the server computing device 214) proceeds to calibrate the uncalibrated power measurement generated by the first processor 216a. The second processor 216b determines (308) a response of each magnetic field sensor to a known power load being drawn through the power distribution point 204. In one example, the second processor is coupled to a calibration circuit (e.g., calibration circuit 209 of the data measurement and processing device 208) capable of introducing resistive and/or reactive loads to the power distribution point 204. It should be appreciated that the calibration circuit can be coupled to the system 200 in a variety of configurations, such as having a separate calibrator device that is plugged into, e.g., a branch circuit 205 connected to the power distribution point 204. The second processor can be programmed to activate the calibration circuit 209 at predetermined times (e.g., turning on a reed switch) so that measurements received from the magnetic field sensors of the sensor module 206 at those times can be evaluated to determine the impact that adding the known power load has on the overall power measurements, and also to determine the relative impact that the known power load has on the wire(s) being monitored by each of the sensors.

In some embodiments, the amount of the known power load can be determined in a variety of ways, including but not limited to obtaining measurements from a smart plug coupled to a branch circuit 205 that connects to the power distribution point 204, obtaining measurements from the power supply 211 of the data measurement and processing device 208, or obtaining measurements from a smart meter coupled to the power distribution point 204.

Figure 6:
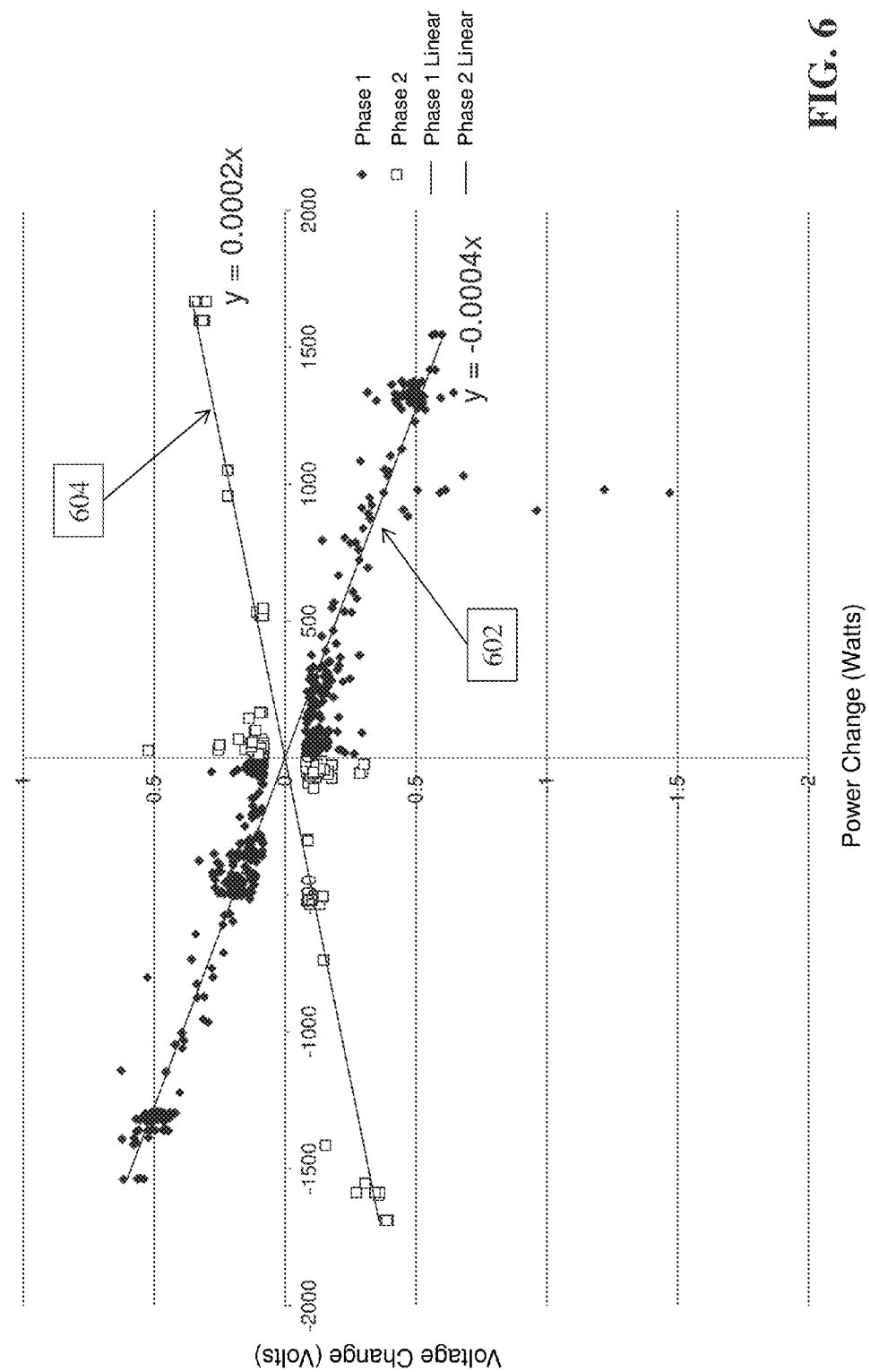
FIG. 6 is an exemplary plot of the linear relationship between power changes sensed by magnetic field sensors and voltage changes.

The overall power load can also be determined by sensing voltage (e.g., using the voltage sensor) and estimating power associated with voltage changes (i.e., determining a relationship between the power flow and voltage changes). FIG. 6 is an exemplary plot of the linear relationship between power changes observed on Phase 1 and Phase 2 [of a home with two phase power] versus voltage changes as measured from the power supply 211 of the data measurement and processing device 208. As shown in FIG. 6, line 602 shows the linear relationship between the power flow on Phase 1 and line 604 shows the linear relationship for Phase 2. The relationship between power changes and voltage changes as seen on a single circuit calibrated with a known load can be used to derive power changes for circuits which have not been, or are unable to be calibrated with a known load. Although the voltage signal is somewhat noisy, by aggregating and clustering many voltage versus power changes over time a more exact relationship can be determined and thus improve the accuracy of the power usage at the power distribution point.

Figure 7A:
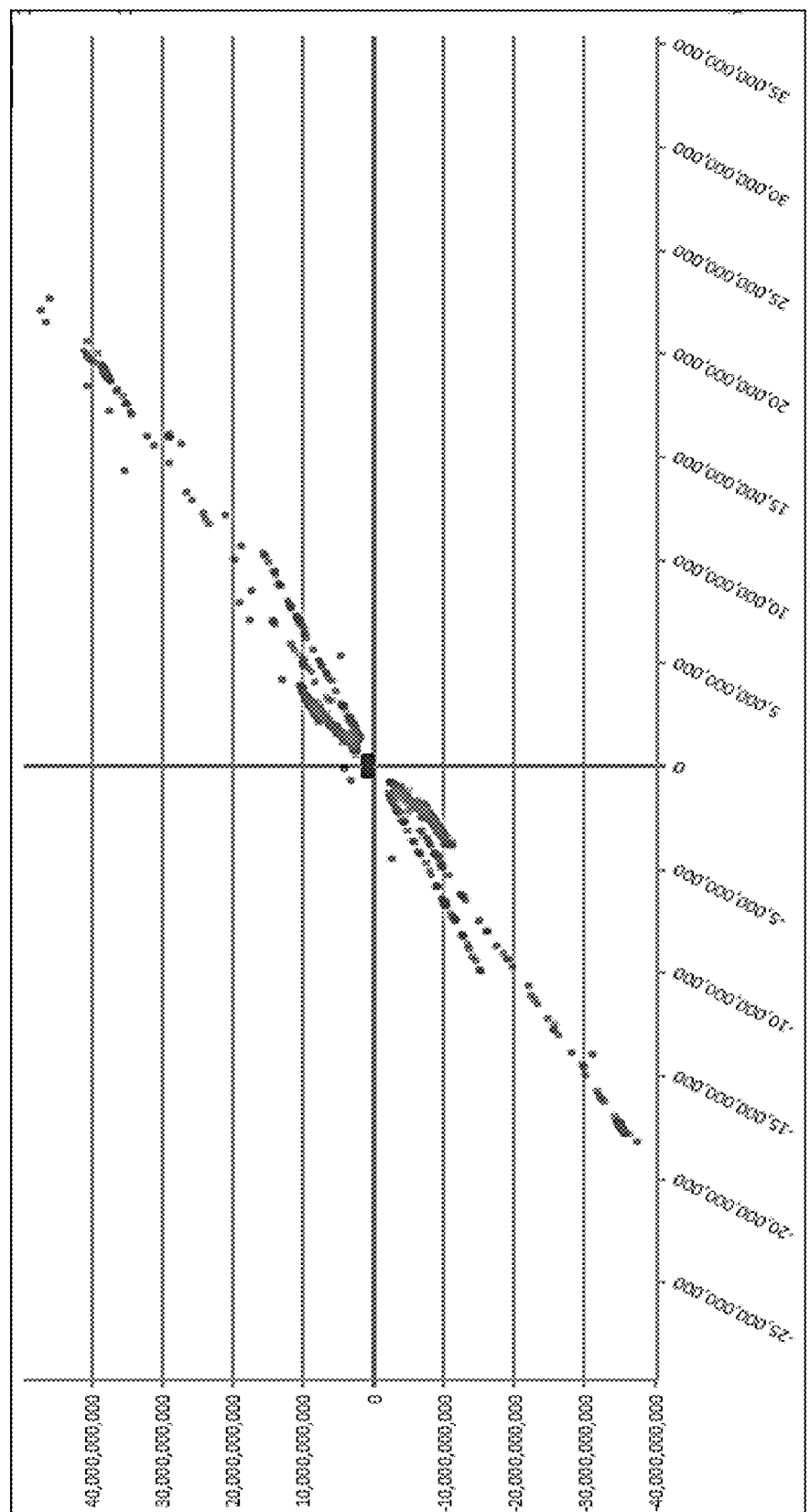
FIGS. 7A-7C are exemplary plots of the magnetic field changes detected by each of magnetic field sensors A, B, and C as plotted against each other (e.g., A vs. B, B vs. C, A vs. C).
Figure 7B:
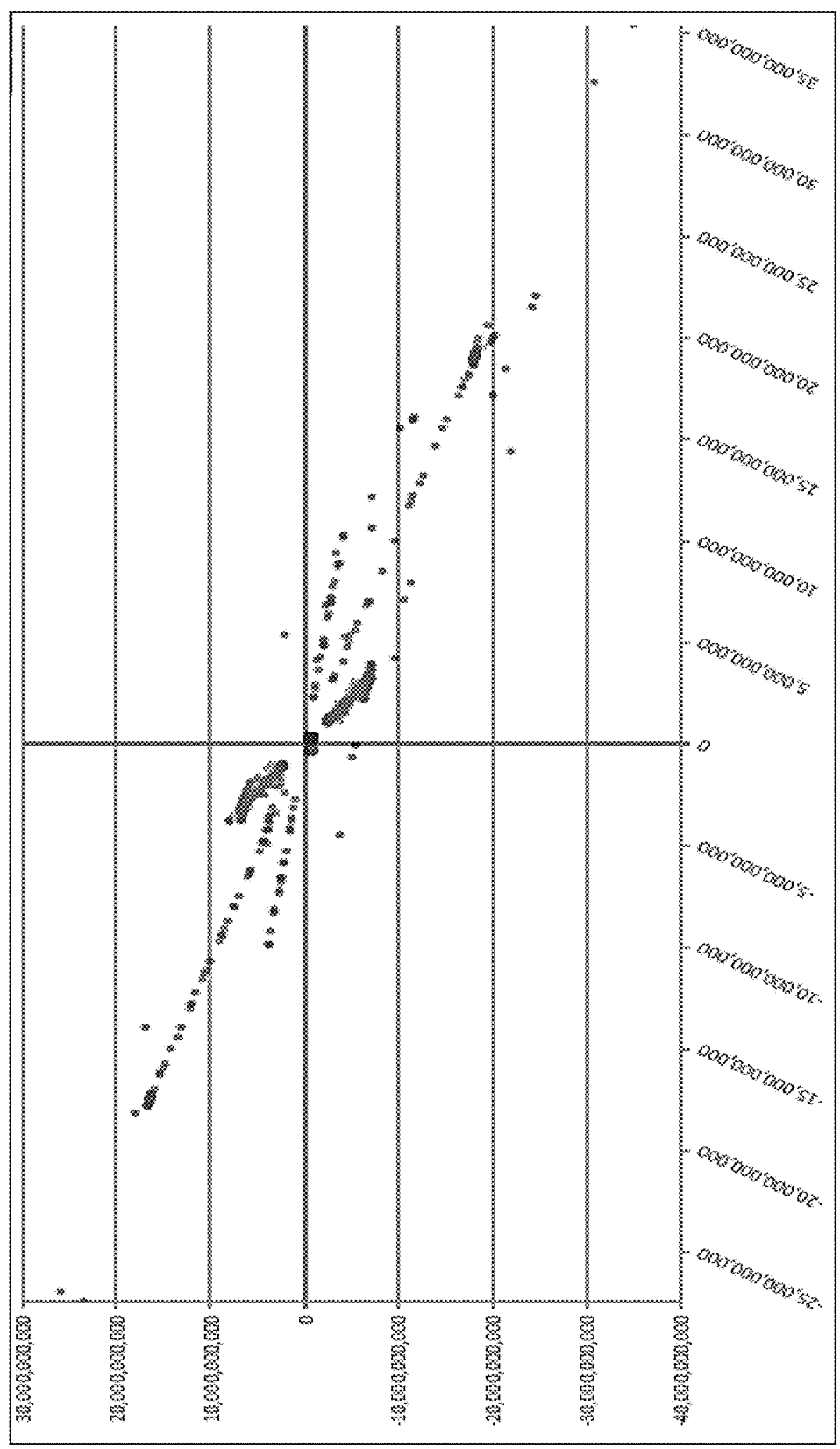
Figure 7C:
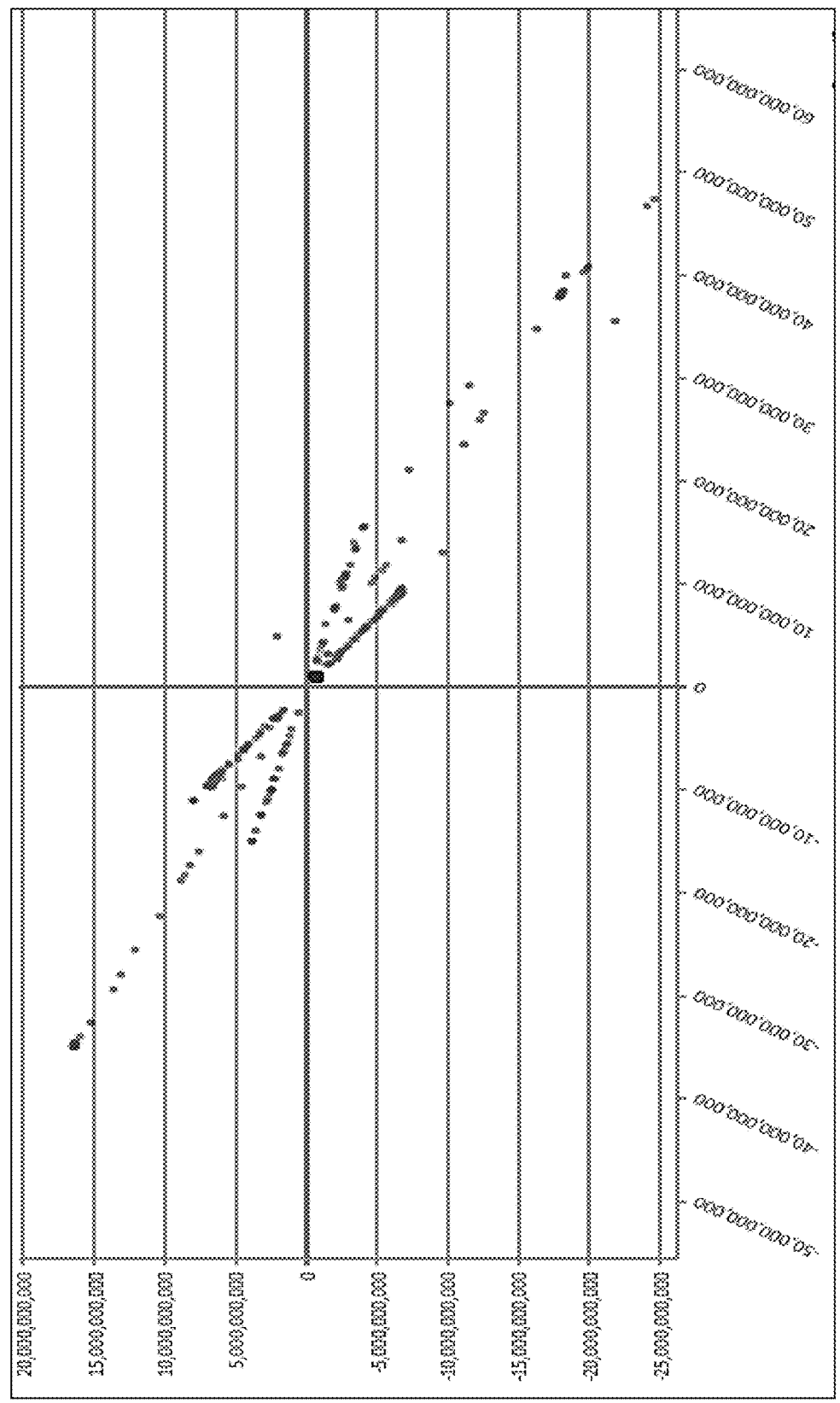

FIGS. 7A-7C each comprises an exemplary plot of the magnetic field changes detected by each of the magnetic field sensors A, B, and C as plotted against each other (e.g., A vs. B, B vs. C, A vs. C). As shown in FIGS. 7A-7C, each of the plots comprises an x-axis and a y-axis that correspond to the respective sensors being plotted. The points on each line represent detection of a change in the known current that is drawn through the power distribution point 204 by the calibration circuit 209.

As shown in FIGS. 7A-7C, the plots comprise two-dimensional data for two magnetic field sensors for ease of representation and illustration. However, it should be appreciated that the second processor plots the magnetic fields detected by each of the sensors against each of the other sensors, regardless of how many sensors are implemented in the sensor module 206. For example, if the sensor module 206 includes eight sensors A through H, the second processor plots the magnetic fields detected by sensor A against each of the other sensors B through H, and so forth for each sensor—resulting in eight dimensions of data, and correspondingly, an eight-dimensional space for plotting the magnetic field changes. As such, computer processing is required to generate this high-dimensional data—which cannot be done without advanced computer processing algorithms and techniques.

Using a data set with high dimensionality enables the second processor to capture and understand variances in each of the respective wires (e.g., wires of service entrance cable 202, wires of branch circuits 205) of the power distribution point 204 because the measurement data for each of the branch circuit wires is almost certain to be different enough to be distinctive from the other branch circuit wires. As such, the second processor has the capability to tell each of the wires apart even if there is noise, and can detect subtle changes in the power profile on each specific branch circuit—which provides several useful advantages as will be detailed later in the specification.

Turning back to FIG. 3, the second processor derives (310) a transfer function using the response of each magnetic field sensor to the known power load and then applies (312) the transfer function to the uncalibrated power measurement for each magnetic field sensor to generate a calibrated power measurement for the power distribution point 204. As mentioned previously, an important feature of the methods and systems described herein is to generate a calibrated power measurement for the power distribution point 204 using the uncalibrated power measurements obtained from each magnetic field sensor of the sensor module 206. Generally, the overall power P flowing through the power distribution point 204 can be represented by the following equation:

$$P = C_0 \cdot P_A + C_1 \cdot P_B + C_2 \cdot P_C + \ldots + C_i \cdot P_n$$

where:
Pn=output of sensor n;
$C_i$=coefficient.

The coefficients associated with each magnetic field sensor output are influenced by three factors:
1) geometry of the sensor relative to the wires, 1/r, where r is the distance from the sensor to the wire being sensed;
2) size of the magnetic loop formed by the circuit; and
3) orientation of the sensor, which falls within a range of −1 to 1.

All three values, 1/r, the size of the loop, and the orientation of the sensor are static values that do not change.

To determine what the coefficients are, the second processor performs the following steps:
1) A "quasi-power" (Q) for each magnetic field sensor (e.g., A through L) that each detects magnetic fields from n wires can be represented by the following equation:

$$\frac{dQ}{dt_A} = C_{1A} \cdot \frac{dI}{dt}wire_1 + C_{2A} \cdot \frac{dI}{dt}wire_2 + \ldots + C_{nA} \cdot \frac{dI}{dt}wire_n$$

$$\ldots$$

$$\frac{dQ}{Dt_L} = C_{1L} \cdot \frac{dI}{dt}wire_1 + C_{2L} \cdot \frac{dI}{dt}wire_2 + \ldots + C_{nL} \cdot \frac{dI}{dt}wire_n$$

2) Each of the above equations is continuously integrated over time as shown in the following example for sensor A:

$$Q_A = C_{1A} \cdot \int \frac{dI}{dt} wire_1 + C_{2A} \cdot \int \frac{dI}{dt} wire_1 + \ldots + C_{nA} \cdot \int \frac{dI}{dt} wire_n$$

to result in the following equation where I(t) represents the current:

$$Q_A = C_{1A} \cdot I(t) wire_1 + C_{2A} \cdot I(t) wire_2 + \ldots + C_{nA} \cdot I(t) wire_n$$

3) Both sides of the equation are then multiplied by the voltage V(t) to determine an instantaneous quasi-power:

$$Q_A \cdot V(t) = C_{1A} \cdot (I(t) \cdot V(t)) wire_1 + C_{2A} \cdot (I(t) \cdot V(t)) wire_2 + \ldots + C_{nA} \cdot (I(t) \cdot V(t)) wire_n$$

4) The equation is then integrated over one or more 60 Hz power cycles to determine an average quasi-power (P) detected by the sensor:

$$P_{QA} = C_{1A} \cdot \int (I(t) \cdot V(t)) wire_1 + C_{2A} \cdot \int (I(t) \cdot V(t)) wire_2 + \ldots + C_{nA} \cdot \int (I(t) \cdot V(t)) wire_n$$

or $$P_{QA} = C_{1A} \cdot P_1 \, wire_1 + C_{2A} \cdot P_2 \, wire_2 + \ldots + C_{nA} \cdot P_n \, wire_n$$

$$P_{QL} = C_{1L} \cdot P_1 \, wire_1 + C_{2L} \cdot P_2 \, wire_2 + \ldots + C_{nL} \cdot P_n \, wire_n$$

The equation above calculates quasi-power at each magnetic field sensor as a function of power flow in each circuit. Inverting the matrix C ($C_{1A}$ to $C_{nL}$) with the response of the sensors to the known calibration load(s) gives an equation of power flow in each circuit as a function of quasi-power at each sensor. The final calibrated power is the signed sum of the power flow in each circuit.

As can be appreciated, power measurement systems that utilize CT clamps do not perform any of the above calculations because the CT clamps measure current directly on the wire to which they are attached. As a result, those systems do not need to calculate calibration coefficients as outlined above.

In some embodiments, the calibration circuit 209 can be configured to draw a small known load through the power distribution point 204. In one example, the calibration circuit 209 is a resistor drawing a current for various numbers of 60 Hz power cycles. Also, in some embodiments, the second processor uses matched field processing in order to determine the calibrated power measurement. For example, the calibration circuit 209 can be configured to draw a known load through the power distribution point 204 every minute at a one-second interval. Because the second processor is configured to understand the time at which the known load is drawn through the power distribution point 204, the second processor adds the individual measurements taken each second together to determine a calibrated power measurement for the power distribution point 204. In another example, the calibration circuit 209 can draw a small known load on a specific cycle of voltage. Because the drawn power is occurring at a specific voltage cycle, the second processor knows which phase the calibration circuit 209 is located on in relation to the phase of the voltage measurement by the second processor.

In some cases, the sensor module 206 can be 'underdetermined' for the power distribution point 204 by including fewer magnetic field sensors than the number of wires being monitored. However, the systems and methods described herein can be adapted to produce calibrated power measurement data for all of the wires, even when the power distribution point 204 has more wires drawing power than the sensor module 206 has sensors. In this example, the second processor can store the data (e.g., measurements and coefficients) for a known wire (e.g., branch circuit) in an auxiliary memory location that is not currently being utilized to perform the continuous calculations described above. The second processor then recalibrates the power measurement data for the remaining branch circuits, including a newly-turned on branch circuit. For example, if branch circuits one through seven are in use and then branch eight is turned on, the second processor stores data for branch circuit one in the auxiliary memory and recalibrates the power measurement data for branch circuits two through eight (as described above). If a change subsequently occurs on branch circuit one, the second processor can determine the number of watts associated with the change and add that value to the power measurement across branch circuits two through eight that are currently being monitored.

Figure 8:
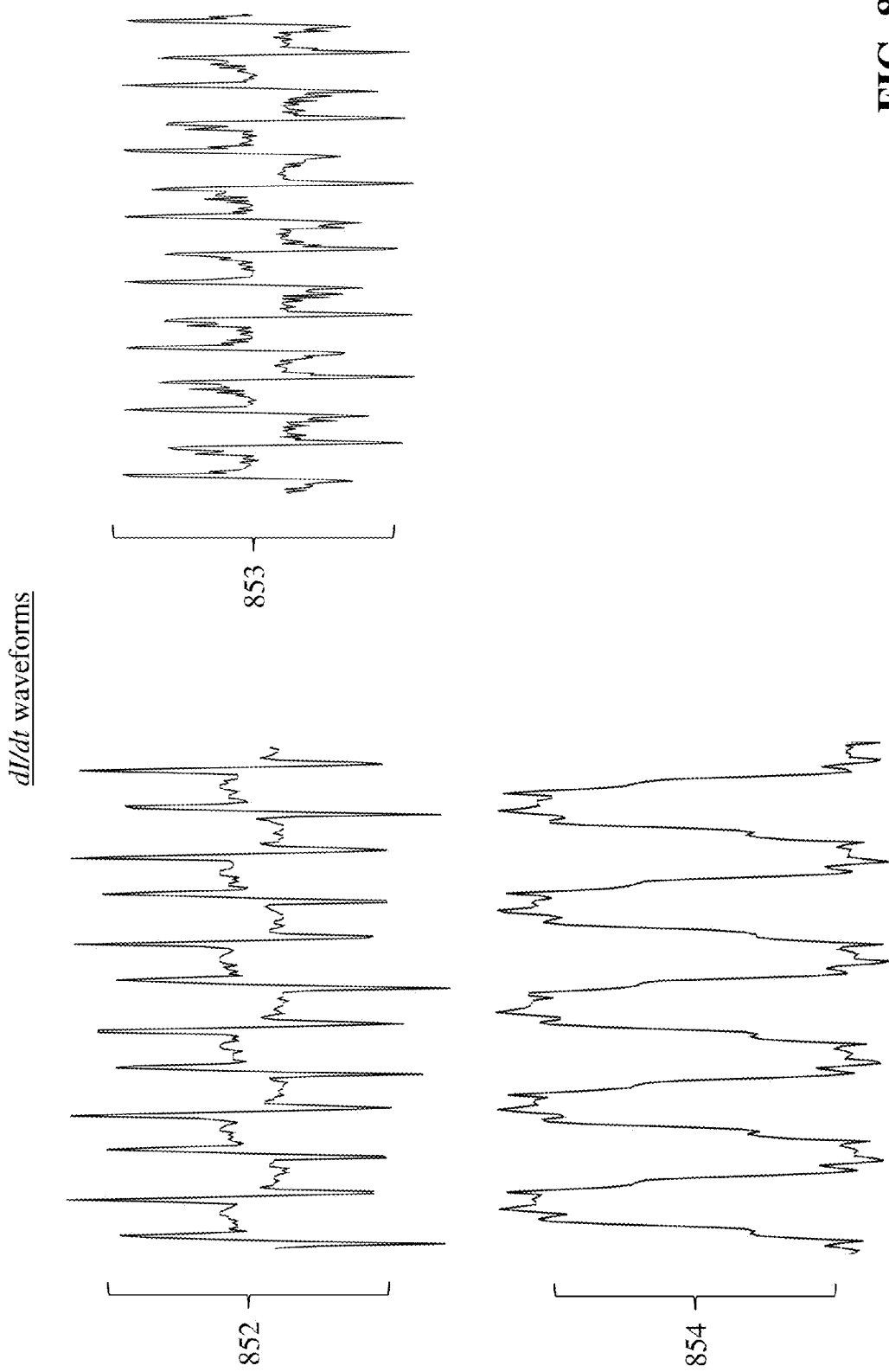
FIG. 8 is a diagram of different waveforms associated with measuring dI/dt on the power distribution point.

As provided above, the RF antenna of the system 200 can be configured to measure a time-varying electric field produced by the time-varying voltage of the system 200, and thus detect very fast changing voltages that may be caused by a variety of circumstances. For example, the waveforms in FIG. 8 show the dI/dt output voltage at three different times with different types of appliances running. Waveforms 852 and 853 correspond to small appliances running with only a small amount of power. Note that there are differences in the waveforms that point to the uniqueness of these waveforms for identifying devices running at that time. Waveform 854, in contrast, corresponds to an air conditioning unit running. Note the high level of detail and various rates of change of each dI/dt graph that correspond to unique signatures of the related appliances. The measurements can be tracked and aggregated to identify problems or dangerous conditions before they cause significant damage or threat (i.e., a spark that, if left unresolved, could start a house fire). In order to detect these details and rates of change (that may be quite small), the first processor (e.g., embedded in the sensor module 206) can be configured to sample data at a high rate (e.g., 100 MHz).

Figure 9:
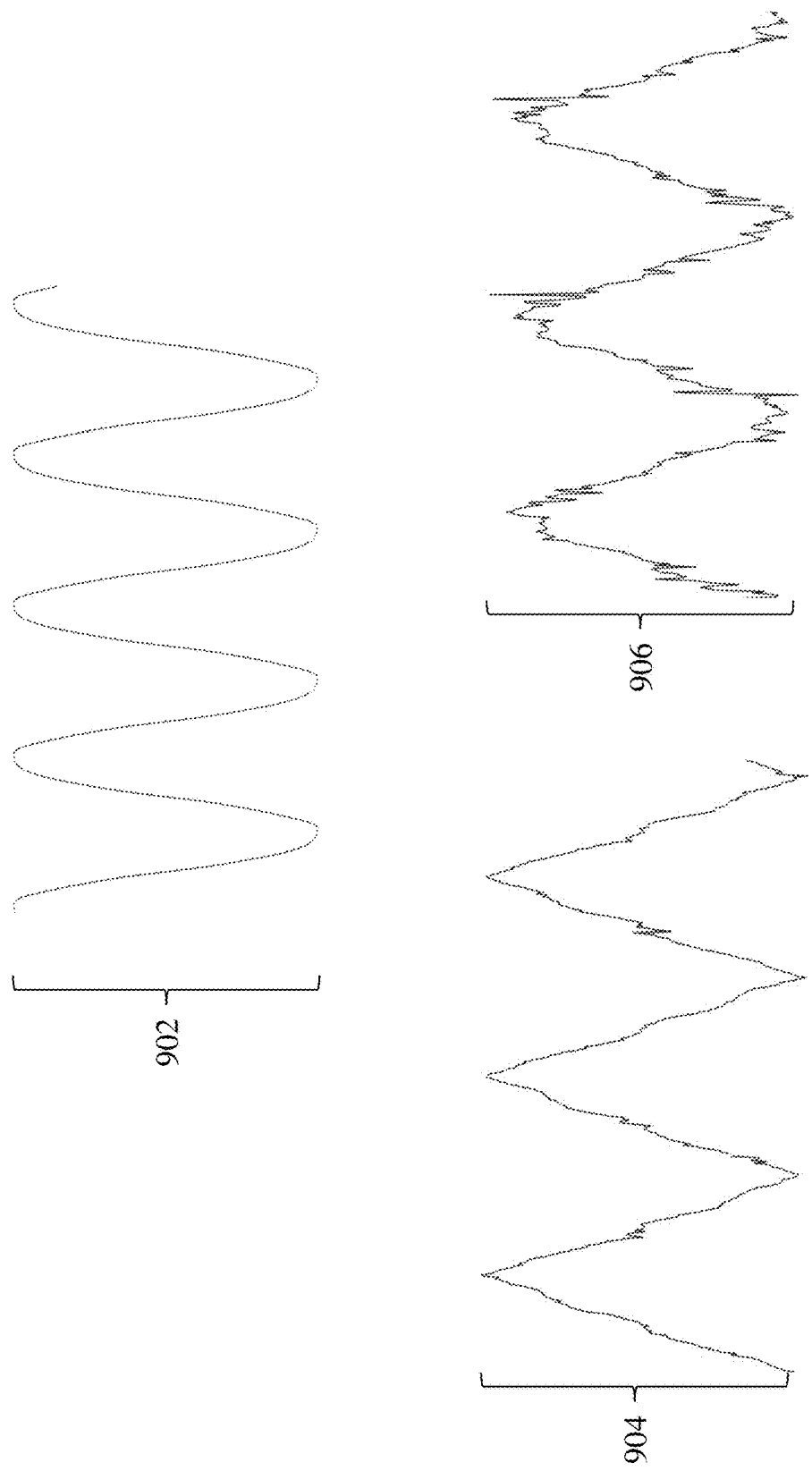
FIG. 9 is a diagram of waveforms showing voltage at three different times with different types of appliances running.

FIG. 9 is a diagram of different waveforms associated with measuring voltage on the power distribution point 204, where waveform 902 represents a measurement of voltage on the line directly (e.g., by directly reading from the 120 Volt power line through a resistor divider circuit), and waveforms 904 and 906 represent measurements of time-varying voltage by the RF antenna of the system 200. As shown in FIG. 9, waveform 902 is smooth and continuous—such that very fast and/or very small changes in voltage are not readily visible. In contrast, the waveforms 904, 906 that are captured by the RF antenna measuring time-varying voltage (dV/dt) contain variances (i.e., jagged lines, peaks, changes in direction) that represent very fast and/or very small changes in voltage. Any of these variances can represent potential dangerous conditions in the electrical system as explained above. Because the system 200 can detect these variances, the measurements can be tracked and aggregated to identify problems or dangerous conditions before they cause significant damage or threat (i.e., a spark that, if left unresolved, could start a house fire).

Another important advantage provided by the systems and methods described herein is the ability to identify individual branch circuits 205 coupled to the power distribution point 204 and monitor the power activity on the individual branch circuits—including identification of specific devices (e.g., appliances, light fixtures, and so forth) that are coupled to certain branch circuits. For example, appliances in a house may have different resistive and reactive loads (inductive or capacitive). Also, many appliances such as those with switching power supplies are designed to pull current at the top of the voltage cycle. Therefore, the power output of the power distribution point 204 (determined by the systems and methods described above) can be further analyzed to understand phase shifts between the supplied voltage and the current delivered to the electrical system that are indicative of appliances that turn on and off.

Figure 10:
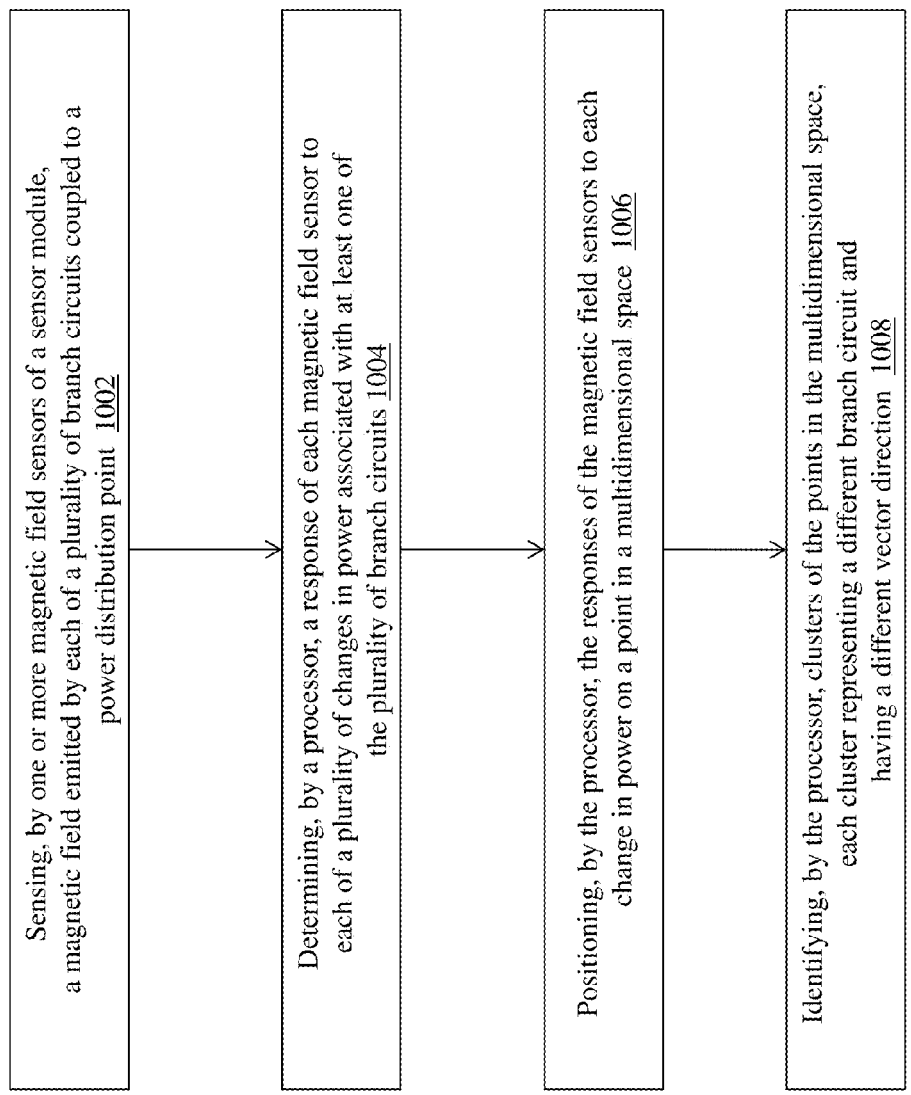
FIG. 10 is a flow diagram of a method of identifying individual branch circuits coupled to a power distribution point.

FIG. 10 is a flow diagram of a method of identifying individual branch circuits coupled to a power distribution point, using the system 200 of FIG. 2. The magnetic field sensors of sensor module 206 sense (1002) a magnetic field emitted by each of a plurality of branch circuits (e.g., branch circuits 205). A processor (e.g., embedded in the sensor module 206, the data measurement and processing module 208, and/or the server computing device 214) determines (1004) a response of each magnetic field sensor to each of a plurality of changes in power associated with at least one of the plurality of branch circuits 205. For example, as devices such as appliances that are coupled to a certain branch circuit 205 change state (i.e., the devices turn on/off), the corresponding changes in power being drawn through the power distribution point 204 via the branch circuit 205 are sensed by the magnetic field sensors. The processor receives data associated with these power changes from each of the sensors.

Figure 11:
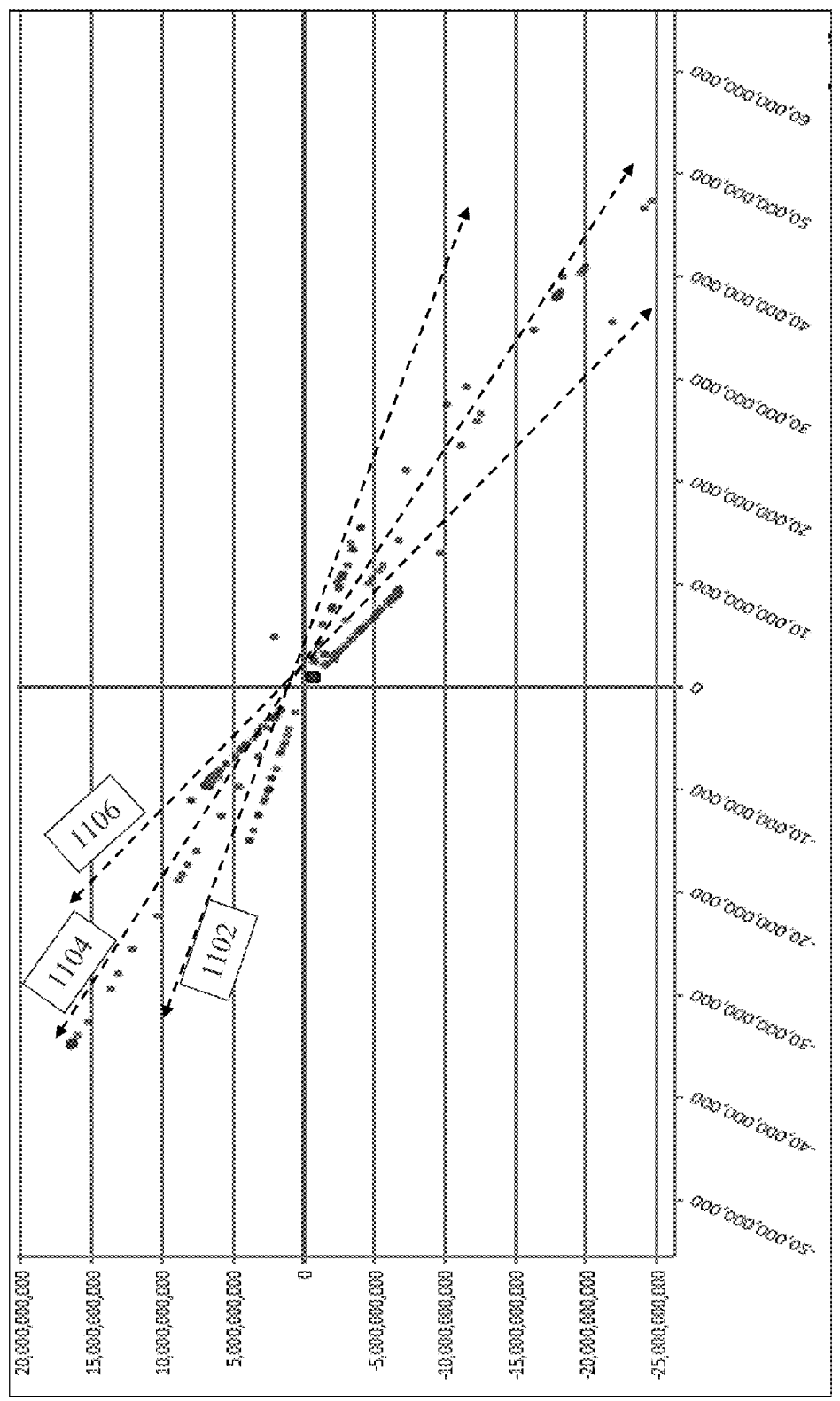
FIG. 11 is an exemplary plot of the linear relationship between power changes sensed by magnetic field sensors and voltage changes, including clusters and vector directions.

The processor positions (1006) the responses of the magnetic field sensors to each change in power on a point in a multidimensional space and identifies (1008) clusters of points in the multidimensional space. As set forth above, if the sensor module 206 includes eight sensors A through H, the processor plots the magnetic fields detected by sensor A against each of the other sensor B through H, and so forth for each sensor—resulting in eight dimensions of data. Therefore, each dimension in the multidimensional space corresponds to a certain magnetic field sensor. Due to the generally linear relationship between power changes detected by one magnetic field sensor in relation to changes detected by a second magnetic field sensor, the interrelated responses of the magnetic field sensors are arranged in linear clusters along a vector direction within the multidimensional space. For example, as shown in FIG. 11, the points are clustered along three distinct vector directions 1102, 1104, 1106. The processor then identifies these clusters as each representing a different branch circuit. It should be appreciated that even if the relationship is non-linear, the separate circuits are still likely to form separate clusters in the multidimensional space.

As mentioned above, using a data set with high dimensionality enables a view into power variances on each of the respective wires of the power distribution point 204 because the measurement data for each of the wires is almost certain to be different enough to be distinctive from the other wires. As such, the second processor has the capability to tell each of the wires apart even if there is noise, and can detect subtle changes in the power profile on each specific branch circuit.

Furthermore, the processor can determine an amplitude associated with each change in power and group one or more points in the multidimensional space that are associated with a single branch circuit and that have a similar amplitude. For example, a device that is coupled to a specific branch circuit 205 draws the same amount of power through the power distribution point 204 via the branch circuit each time the device turns on. It can be assumed that this change in power from a single device generally has the same amplitude. Therefore, the processor plots the points associated with the responses of the magnetic field sensors that the change in power at or close to the same location in the multidimensional space. The processor can then determine that a group of points in a specific cluster (i.e., thereby being associated with a specific branch circuit) that are close to each other in the multidimensional space correspond to the same device on that branch circuit. Then, the processor identifies a state change of a device coupled to the branch circuit based upon the group of points and the amplitude. These processing techniques provide a significant advantage in the context of device power disaggregation because all devices that are connected to the branch circuits of a particular power distribution system (e.g., an electrical breaker box in a home) are segregated first by identification of the branch circuit to which they are connected. As a result, the system provides a more efficient and simpler way to identify and track devices and their power usage due to this segregation. Existing technology such as CT clamps are deficient because they cannot accomplish segregation of devices by branch circuit.

Figure 12:
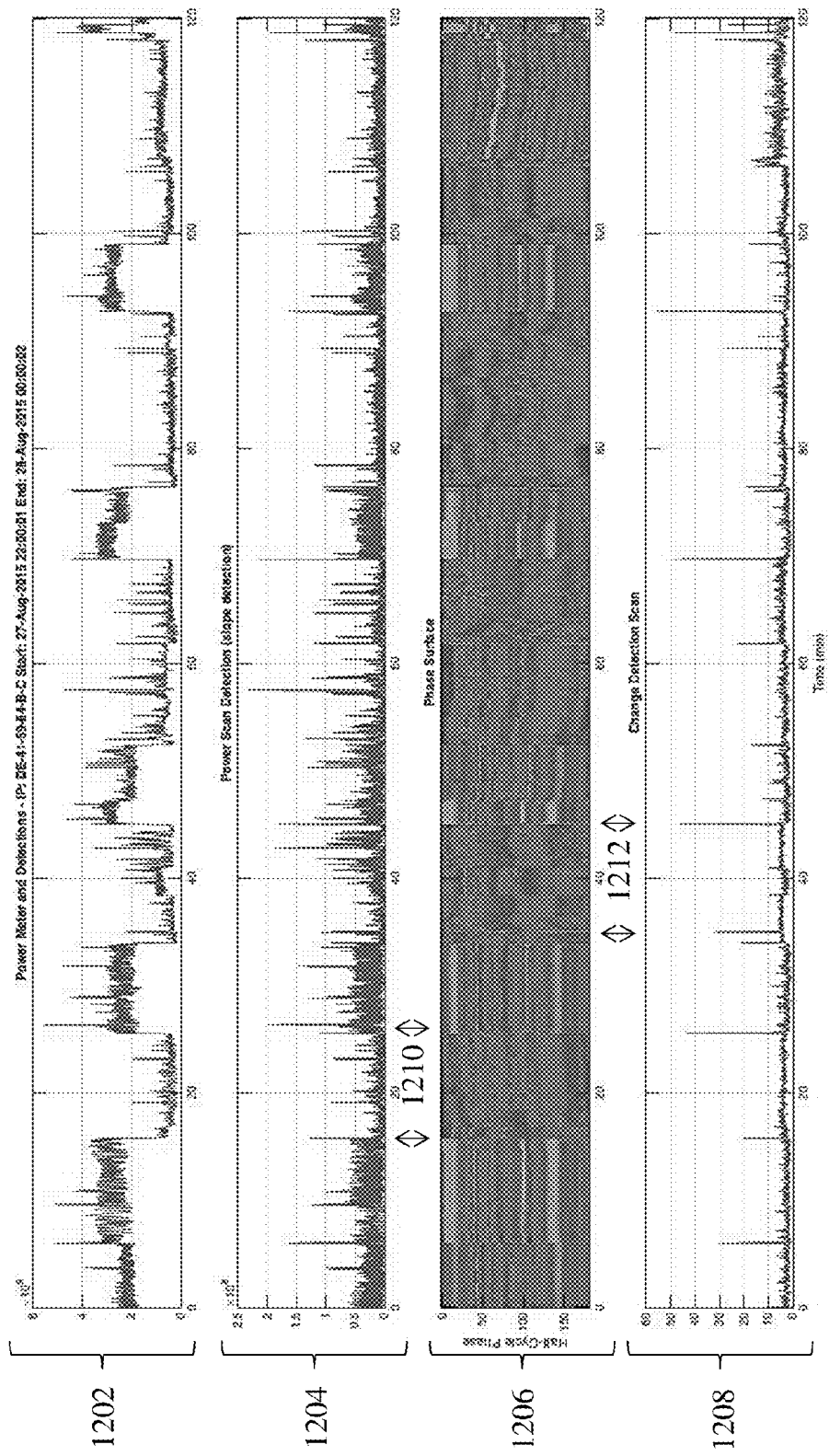
FIG. 12 is a diagram of graphs to show how a waveform of power output is analyzed to produce a change detection.

FIG. 12 is a diagram of several graphs that show how the waveform of the power output can be analyzed to produce a change detection where each spike represents an appliance or other electrical device turning on or off. As shown in FIG. 12, the top waveform 1202 represents the power output of the power distribution point 204 for a particular period of time, as determined by the power measurements taken and processed by the sensor module 206 and the data measurement and processing device 208. Currently, change detection techniques look for simple abrupt changes in the power level to attempt to determine when devices are turning on and off. As can be seen in graph 1204, this leads to a very noisy environment and makes it difficult to isolate specific appliances. By computing real-time phase differences between the current and the voltage, the system 200 can derive a phase surface graph 1206 that shows the phase shifts which occur as the supplied voltage and current delivered change over time. As represented in FIG. 12, the spikes depicted in graph 1204 generally line up with the phase shifts occurring in graph 1206 (see arrows 1210). Lastly, the device 208 can convert the phase surface graph into a change detection scan 1208, where the spikes correspond to phase shifts (see arrows 1212) and represent, e.g., an appliance turning on or off. As a result, using this technique the system 200 can more easily isolate specific points in time when significant changes in power occur and represent them in a readily understandable way—in order to understand power usage of appliances and identify any potential issues.

Also, as set forth above, the data measurement and processing device 208 can be coupled to a network 212 in order to communicate with a server computing device 214 that may be located remotely from the home or business in which the electrical panel 204, sensor module 206 and device 208 are installed. The server computing device 214 can receive power measurement data from the device 208 for storage (e.g., in a database coupled to the server 214) and further processing (e.g., calibration of circuits), and to provide related services—such as reporting and alerting functions. In one example, a homeowner can access the server computing device (e.g., a PC or mobile phone using an Internet browser) to review power measurement data for his or her home and receive related information, such as energy usage reports, safety alerts, notifications, and schedules. The server computing device 214 can be configured to provide power measurement data and related information in real-time, so that the homeowner has an up-to-date and accurate picture of power usage in the home. In some embodiments, the user can specify to the system 200 when particular appliances or devices are on and/or off, and the system 200 can correlate this user-provided information to the data collected by the sensor module 206 and processed by the device 208 to detect specific voltage/current/power consumption signatures associated with the appliances and then use those signatures to identify the same appliances during future analyses of the power measurement data. Also, the user interface can detect signatures for certain devices or appliances that may not be recognized or known to the system 200 in advance, and display those to a user via the reporting function.

Figure 13:
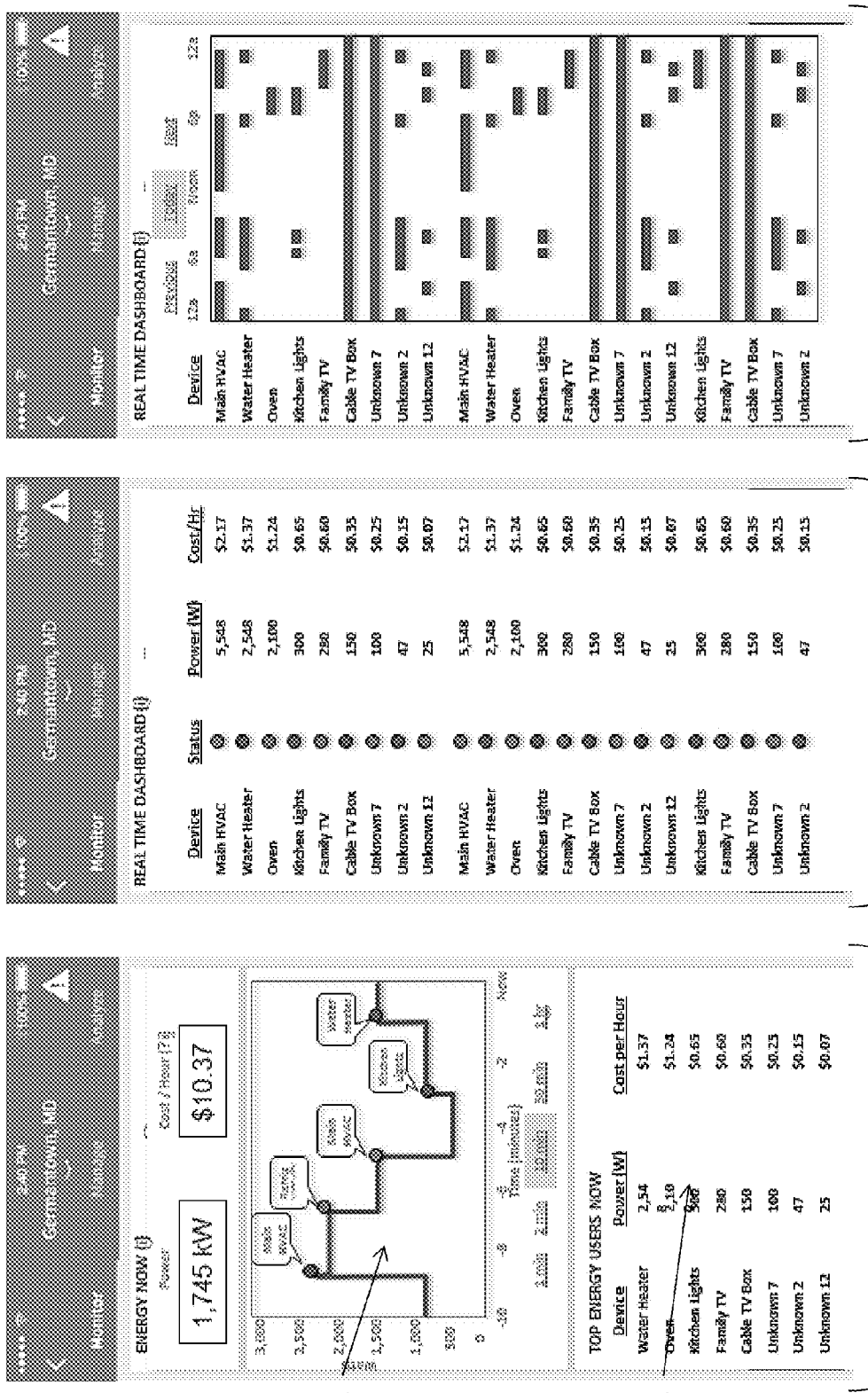
FIGS. 13 and 14 are diagrams of screenshots of an exemplary reporting dashboard user interface.

FIG. 13 is a diagram of screenshots of an exemplary reporting dashboard user interface provided by the server computing device 214 of system 200. As shown in FIG. 13, the dashboard user interface includes various reports and tabulations associated with the power measurement being performed by the sensor module 206 and the data measurement and processing device 208. For example, the dashboard can include a report on current energy usage 1302, including a graph 1304 showing activation and deactivation of certain appliances or power consumption devices in the home (HVAC, refrigerator, kitchen lights, and so forth), and the corresponding impact on energy usage. The current energy usage 1302 report also includes a table 1306 showing the devices/appliances that are using the most energy right now, along with a corresponding cost per hour to provide the energy being used. The dashboard can also include an energy usage report 1308 that shows the current status of each device (i.e., red=off, green=on) along with the power usage and cost per hour, in an easy to review format.

Next, the dashboard can also include a chart 1310 that shows the energy consumption of each device/appliance in the home throughout the day. For example, as shown in chart 1310, the main HVAC system in the home was running from 7 am to 10 am, again from 12 pm to 6 pm, and again from 8 pm to 12 am. In another example, the cable TV box was consuming power constantly throughout the day. The user interface depicted in FIG. 13 provides a clear picture to the homeowner of the operation of devices and appliances in the home, as well as their corresponding energy consumption and cost per hour. Furthermore, any of the user interfaces in the dashboard can be augmented with the mapping data as described above, such that the dashboard can indicate that the cable TV box in a specific upstairs bedroom (which is associated with a specific circuit in the home) was consuming power constantly throughout the day.

Figure 14:
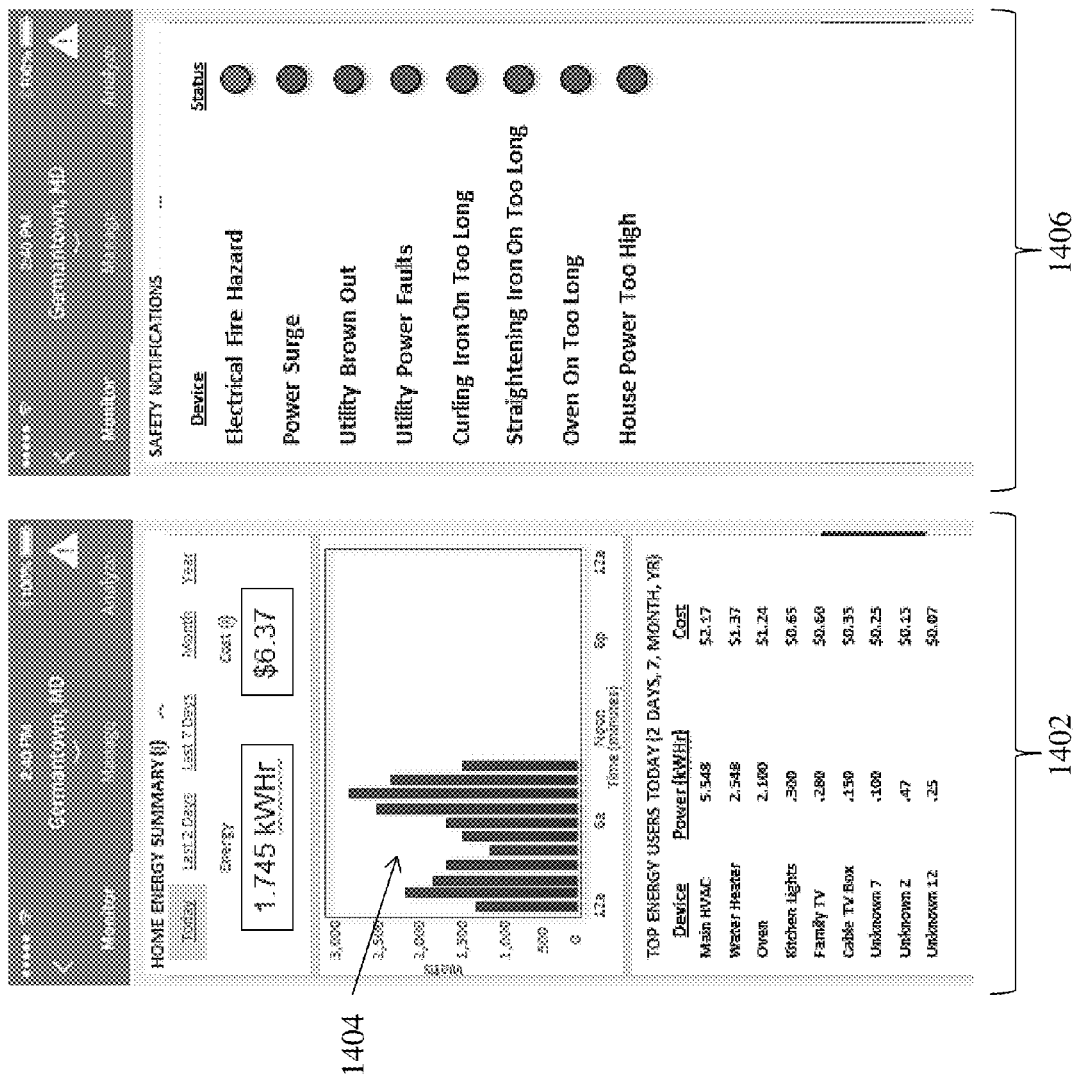

FIG. 14 is a diagram of additional screenshots of the exemplary reporting dashboard user interface provided by the server computing device 214 of system 200. As shown in FIG. 14, the dashboard can include a home energy summary report 1402 with a chart 1404 showing overall energy usage in the home during a certain time period (e.g., today). The chart 1404 can be configured to show energy usage for other time periods, such as the last two days, last seven days, last month, and last year. The dashboard can also include a safety notifications table 1406 that lists common electrical hazards in the home along with a status indicator to show the homeowner whether one of these hazards could be present in the home, based upon the system's 200 detection and analysis of power usage, as described in detail above.

As can be appreciated, the portable, plug-in calibrator described above can be used in conjunction with a mobile application (e.g., executing on a smartphone or other mobile computing device) in order to identify which circuits correspond to specific locations in the home. For example, a user can plug the portable calibrator into a receptacle in a particular room of the home that is located on a certain branch circuit, and the calibrator can draw a known power load through the power distribution point 204. In one example, the magnetic field data sensed by the sensor module 206 and processed by the data measurement and processing device 208 can be sent to the server computing device 214 for calibration as described previously. In addition, the mobile application communicates with the server computing device 214 to provide a notification to the user when the calibration is complete and to receive information from the user regarding the location of the calibrator in the home that can be used to map the location to the circuit being calibrated.

Figure 15:
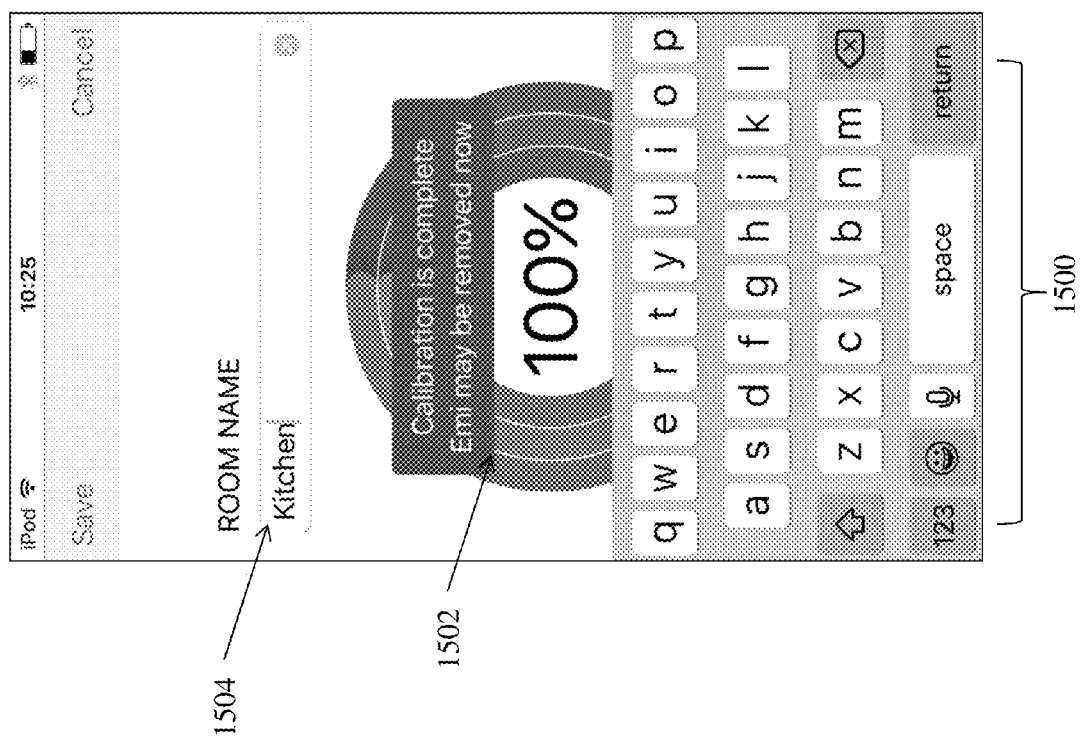
FIG. 15 is a diagram of a screenshot of an exemplary user interface for mapping a location in the home to a circuit.

FIG. 15 is a screenshot of an exemplary user interface 1500 for mapping a location in the home to a branch circuit. As shown in FIG. 15, the user interface 1500 includes an indicator 1502 (e.g., text and/or a percentage graphic) that calibration of the branch circuit to which the calibrator has been connected is complete. The user interface 1500 also includes a user input field 1504 that enables the user to enter, e.g., the name of the room in which the calibrator is plugged in. The mobile device transmits the user input to the server computing device 214, which stores the user input in a mapping to the branch circuit data. Once the system 200 has generated this mapping data, subsequent notification of potential hazards in the household electrical system can include the location data and thus be more precise and actionable for the user (e.g., a 100-watt device has turned on in the kitchen or a potential fire hazard is detected on the living room branch circuit).

Figure 16:
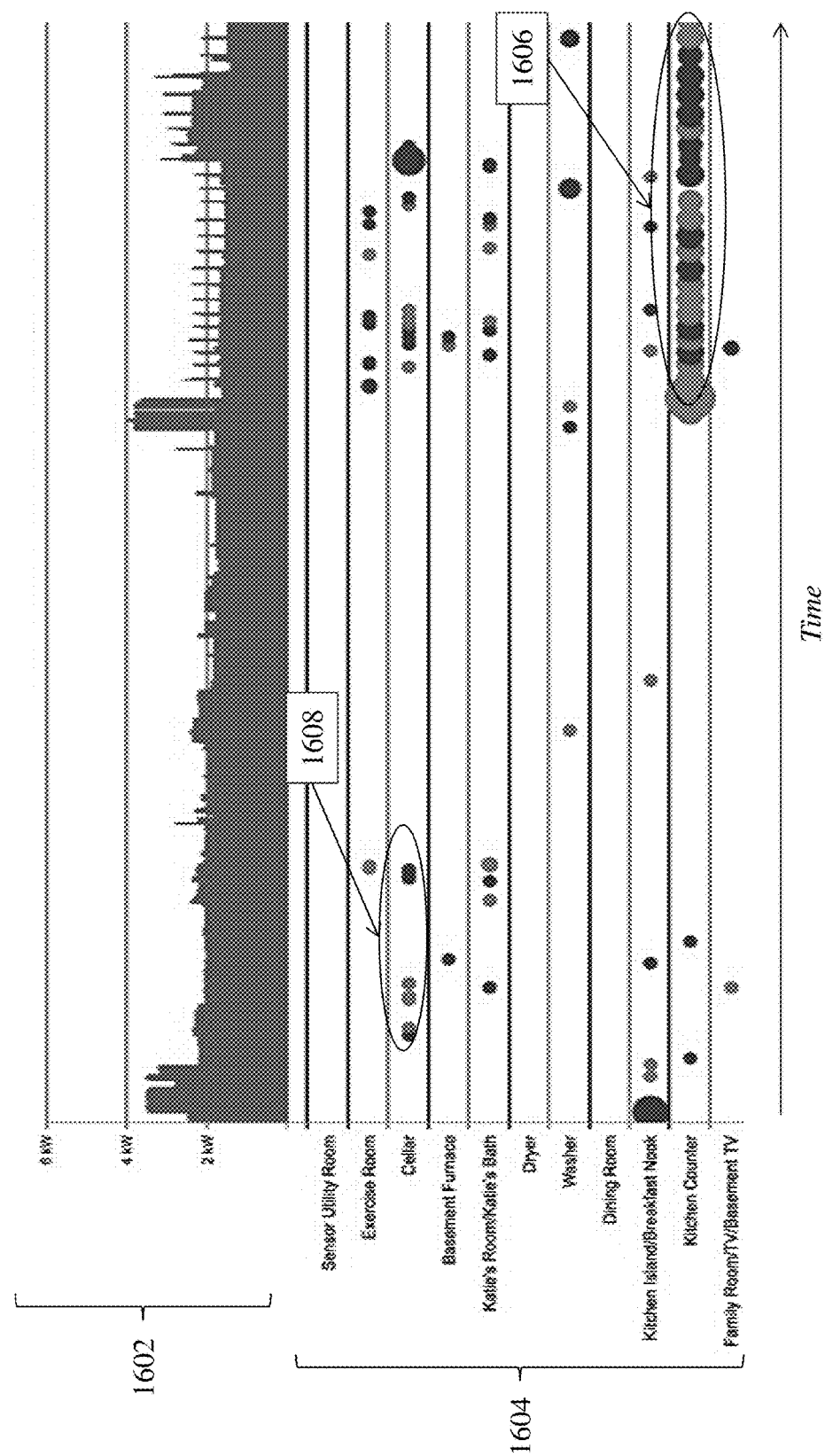
FIG. 16 is a diagram of an exemplary dot graph depicting the power usage for devices on certain branch circuits.

FIG. 16 is a diagram of an exemplary dot graph depicting the power usage for devices on certain branch circuits based upon the measurements and analysis performed by the system 200 of FIG. 2 as described above. As shown in FIG. 16, the graph at the top 1602 depicts the total power flowing through the power distribution point (e.g., an electrical breaker box) to which each of the branch circuits 1604 is connected over a period of time (from left to right).

Each of the rows associated with a particular branch circuit includes a series of dots in varying colors (e.g., green & red, light gray & dark gray). Each of the dots correspond to a point in time when a device coupled to the corresponding branch circuit 1604 turned on or off. For example, a red dot indicates that a device turned off while a green dot represents when a device turned on. The size of a dot relates to the amount of power of the device. It should be noted that the branch circuits 1604 are labeled (e.g., using the mobile application as described above with respect to FIG. 15) according to their location, such that a user can easily and quickly understand a location in a particular building (e.g., a residence) to which the devices are connected and the patterns of energy usage that occur on the branch circuits.

In one example, the series of dots 1606 on the "Kitchen" branch circuit may correspond to a coffee maker turning on and off regularly to keep the coffee temperature even. In another example, the series of dots 1608 may correspond to an HVAC unit in the cellar which turns on/off at different times and at different rates.

Based on the advantageous collection, processing, collation and presentation of the power measurement and branch circuit identification data described herein, the system 200 acts as a pre-smoke detector because it can detect potential fire hazards like sparks, failing appliances, abnormal power usage, and the like at a very early stage—before the threat of actual fire even exists. The system's 200 advanced detection and data processing techniques provide timely and important information and alerts to the homeowner, so that he or she can be aware of dangerous conditions almost as soon as such conditions are present in the home's electrical system and take immediate action to ameliorate the danger.

Another advantageous aspect of the system and method described herein is the ability to determine whether external events (e.g., events happening upstream from the home in the utility distribution system) are impacting power delivery to the home and thus, may be representative of issues such as transformer failure or a surge on the utility line. In this embodiment, the system 200 can be installed in multiple homes that connect to the same utility distribution system. As power measurements are taken by the installed systems at each home, external energy events that are detected by the respective systems can be correlated (e.g., the systems detect a similar current/voltage change at the same time, and which is not directly attributable to any devices or circuits inside the home) and a notification or alert can be generated for the utility operator to investigate potential causes. In some embodiments, the current/voltage change may have a signature that is indicative of specific equipment failure (e.g., a transformer) and the signature can be provided to the utility operator to help pinpoint the equipment responsible for the power change. In order to identify utility issues, the system 200 can sample data at high rates (e.g., on the order of 100 MHz) and the corresponding data is synchronized between homes using an accurate and stable clock source so that external events can be correlated. Events can be correlated between sensors measuring dI/dt or via the antenna measuring dV/dt. Events may also be correlated with external environmental factors such as weather (temperature, winds, rain or lightning) or solar events to help diagnose reasons for failure.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the technology by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit), or the like. Subroutines can refer to portions of the stored computer program and/or the processor, and/or the special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage mediums suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system that includes any combination of such back-end, middleware, or front-end components.

The components of the computing system can be interconnected by transmission medium, which can include any form or medium of digital or analog data communication (e.g., a communication network). Transmission medium can include one or more packet-based networks and/or one or more circuit-based networks in any configuration. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), Bluetooth, Wi-Fi, WiMAX, general packet radio service (GPRS) network, HiperLAN), and/or other packet-based networks. Circuit-based networks can include, for example, the public switched telephone network (PSTN), a legacy private branch exchange (PBX), a wireless network (e.g., RAN, code-division multiple access (CDMA) network, time division multiple access (TDMA) network, global system for mobile communications (GSM) network), and/or other circuit-based networks.

Information transfer over transmission medium can be based on one or more communication protocols. Communication protocols can include, for example, Ethernet protocol, Internet Protocol (IP), Voice over IP (VOIP), a Peer-to-Peer (P2P) protocol, Hypertext Transfer Protocol (HTTP), Session Initiation Protocol (SIP), H.323, Media Gateway Control Protocol (MGCP), Signaling System #7 (SS7), a Global System for Mobile Communications (GSM) protocol, a Push-to-Talk (PTT) protocol, a PTT over Cellular (POC) protocol, and/or other communication protocols.

Devices of the computing system can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). Mobile computing device include, for example, a Blackberry®. IP phones include, for example, a Cisco® Unified IP Phone 7985G available from Cisco Systems, Inc, and/or a Cisco® Unified Wireless Phone 7920 available from Cisco Systems, Inc.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein.

What is claimed is:

1. A method of identifying individual branch circuits coupled to a power distribution point, the method comprising:
    sensing, by a plurality of magnetic field sensors of a sensor module, a magnetic field emitted by each of a plurality of branch circuits coupled to the power distribution point, wherein the sensor module is positioned in proximity to the power distribution point;
    determining, by a processor coupled to the sensor module, a response of each magnetic field sensor to each of a plurality of changes in power associated with at least one of the plurality of branch circuits;
    positioning, by the processor, each response of the magnetic field sensors to each change in power on a point in a multidimensional space, wherein each dimension of the multidimensional space corresponds to a magnetic field sensor; and
    identifying, by the processor, clusters of the points in the multidimensional space, each cluster representing a different branch circuit and having a different vector direction.

2. The method of claim 1, further comprising:
    determining, by the processor, an amplitude associated with each change in power;
    grouping, by the processor, one or more points in the multidimensional space that are associated with a single branch circuit and that have a similar amplitude; and
    identifying, by the processor, a state change of a device coupled to the branch circuit based upon the amplitude.

3. The method of claim 1, wherein each identified cluster of points in the multidimensional space is arranged in a line along the associated vector direction.

4. The method of claim 1, further comprising determining whether at least one of the changes in power corresponds to a hazard associated with the branch circuit.

5. The method of claim 1, further comprising:
    drawing, by a calibration device coupled to one of the branch circuits, a known power load through the power distribution point; and
    identifying, by the processor, the branch circuit to which the calibration device is attached based upon measurement of the known power load by the sensor module.

6. The method of claim 5, wherein the calibration device is a portable calibrator plugged into a receptacle on one of the branch circuits.

7. The method of claim 5, further comprising:
    transmitting, by the processor, information associated with the identified branch circuit to which the calibration device is attached to a mobile computing device;
    receiving, by the processor, a location identifier associated with a physical location of the identified branch circuit; and
    mapping, by the processor, the location identifier to the identified branch circuit.

8. The method of claim 1, wherein the sensor module comprises fewer magnetic field sensors than a number of branch circuits.

9. The method of claim 8, further comprising storing, by the processor, measurement data associated with at least a plurality of the branch circuits in an auxiliary memory coupled to the processor.

10. A system for identifying individual branch circuits coupled to a power distribution point, the system comprising:
    a sensor module with a plurality of magnetic field sensors configured to sense a magnetic field emitted by each of a plurality of branch circuits coupled to the power distribution point, wherein the sensor module is positioned in proximity to the power distribution point; and
    a processor coupled to the sensor module, the processor configured to:
        determine a response of each magnetic field sensor to each of a plurality of changes in power associated with at least one of the plurality of branch circuits;
        position each response of the magnetic field sensors to each change in power on a point in a multidimensional space, wherein each dimension of the multidimensional space corresponds to a magnetic field sensor;
        identify clusters of the points in the multidimensional space, each cluster representing a different branch circuit and having a different vector direction.

11. The system of claim 10, wherein the processor is further configured to:
    determine an amplitude associated with each change in power;
    group one or more points in the multidimensional space that are associated with a single branch circuit and that have a similar amplitude; and identify a state change of a device coupled to the branch circuit based upon the amplitude.

12. The system of claim 10, wherein each identified cluster of points in the multidimensional space is arranged in a line along the associated vector direction.

13. The system of claim 10, wherein the processor is further configured to determine whether at least one of the changes in power corresponds to a hazard associated with the branch circuit.

14. The system of claim 10, further comprising a calibration device coupled to one of the branch circuits and configured to draw a known power load through the power distribution point, the processor configured to identify the branch circuit to which the calibration device is attached based upon measurement of the known power load by the sensor module.

15. The system of claim 14, wherein the calibration device is a portable calibrator plugged into a receptacle on one of the branch circuits.

16. The system of claim 10, wherein the processor is further configured to:

transmit information associated with the identified branch circuit to which the calibration device is attached to a mobile computing device;

receive a location identifier associated with a physical location of the identified branch circuit; and map the location identifier to the identified branch circuit.

17. The system of claim 10, wherein the sensor module comprises fewer magnetic field sensors than a number of branch circuits.

18. The system of claim 17, wherein the processor is further configured to store measurement data associated with at least a plurality of the branch circuits in an auxiliary memory coupled to the processor.

* * * * *